United States Patent [19]

Margolin

[11] Patent Number: 5,978,488

[45] Date of Patent: Nov. 2, 1999

[54] SIMULATED AM RADIO

[76] Inventor: Jed Margolin, 3570 Pleasant Echo Dr., San Jose, Calif. 95148-1916

[21] Appl. No.: 09/148,045

[22] Filed: Sep. 3, 1998

[51] Int. Cl.[6] .................................................. H03G 3/00
[52] U.S. Cl. ................................ 381/61; 381/80; 381/124
[58] Field of Search ............................... 381/4, 2, 61, 80, 381/81, 94.7, 98, 101, 102, 109, 119, 77, 124; 455/161.1, 168.1, 176.1, 177.1, 180.1, 188.1, 192.3, 197.1, 221, 222; 375/268, 300, 318, 320, 324, 344, 346, 345

[56] References Cited

U.S. PATENT DOCUMENTS

| | | |
|---|---|---|
| 1,342,885 | 6/1920 | Armstrong . |
| 1,501,543 | 7/1924 | Hammarlund . |
| 1,604,552 | 10/1926 | Hammarlund . |
| 4,467,373 | 8/1984 | Taylor et al. . |
| 4,604,064 | 8/1986 | Boehm et al. . |
| 4,933,980 | 6/1990 | Thompson ................................. 381/61 |
| 5,056,432 | 10/1991 | Sasaki et al. ............................. 381/61 |
| 5,442,711 | 8/1995 | Toyama .................................. 381/119 |
| 5,530,924 | 6/1996 | Miller ..................................... 381/101 |
| 5,577,128 | 11/1996 | Farinelli, Jr. ............................. 381/81 |
| 5,652,800 | 7/1997 | Roberts .................................. 381/119 |
| 5,774,567 | 6/1998 | Heyl ...................................... 381/119 |
| 5,883,963 | 3/1999 | Tonella ................................... 381/102 |

OTHER PUBLICATIONS

A. Bruce Carlson, Communications Systems, pp. 194–199, 208–211, McGraw–Hill Book Company, 1968.

Direct TV Hardware—A More Technical Explanation, "The High–Tech Behind Broadcasting DIRECTTV", http://www.directtv.com/hardware/tech.htm.

QVC, Inc., Product Detail, Crosley CR32 Replica Cathedral Style AM/FM Radio/Cassette, http://www.qvc.com/scripts/detail.dll?Products&E48476.

Catalog, Winter 1997, Radio Spirits, Inc. P.O. Box 2141, Schiller Park, IL 60176.

Code of Federal Regulations, Title 47, vol. 4, Part 73, Revised as of Oct. 1, 1997, Sec. 73.44 "AM transmission system emission limitations." Subsections (a), (b).

Instruction Manual, GE Superadio III, Model 7–2887, Thomson Consumer Electronics, Ronks, PA.

Sony Playstation, Tech Specs, http://www.playstation/hardware/techspecs.asp.

*Primary Examiner*—Forester W. Isen
*Assistant Examiner*—Xu Mei

[57] ABSTRACT

A realistic illusion of listening to an actual AM radio is produced by providing a number of audio program signals and by simulating the process of tuning across the radio dial where each station is playing a different program. In a superheterodyne receiver using envelope detection, tuning a station off-channel results in a changing mixture of distortion and noise. The distortion function is caused by a variety of processes, among them being the filtering action as parts of the signal spectrum are cut off by the bandpass filter in the IF amplifier. Another is caused by the reduction in the carrier which causes the foldover of negative peaks in the envelope detector.

18 Claims, 27 Drawing Sheets

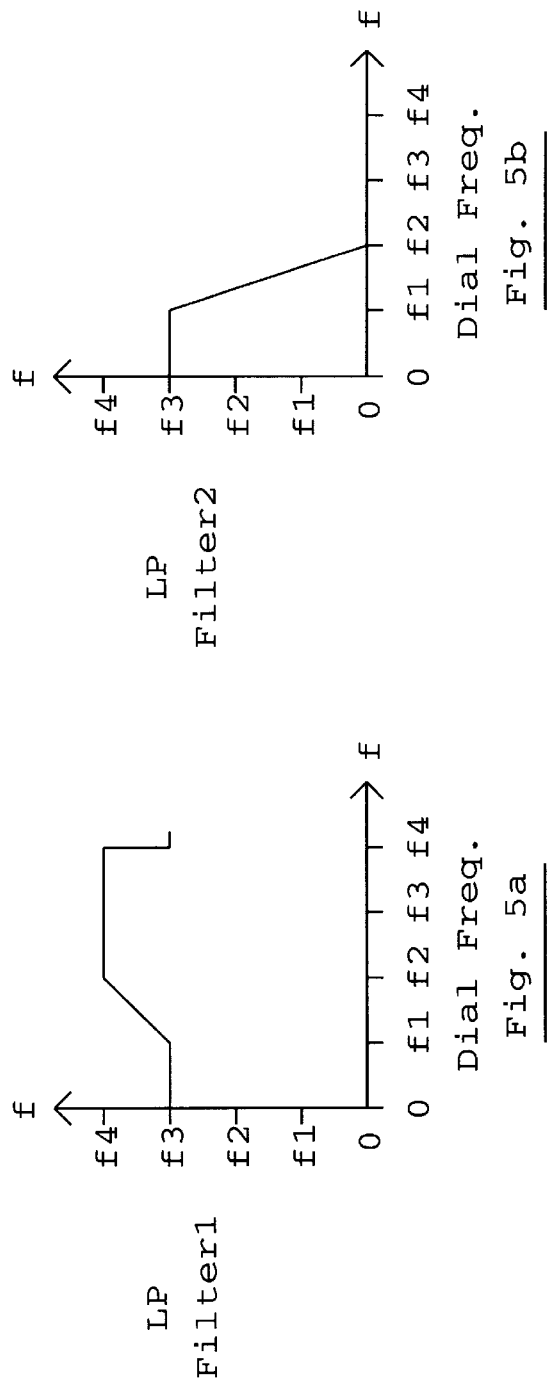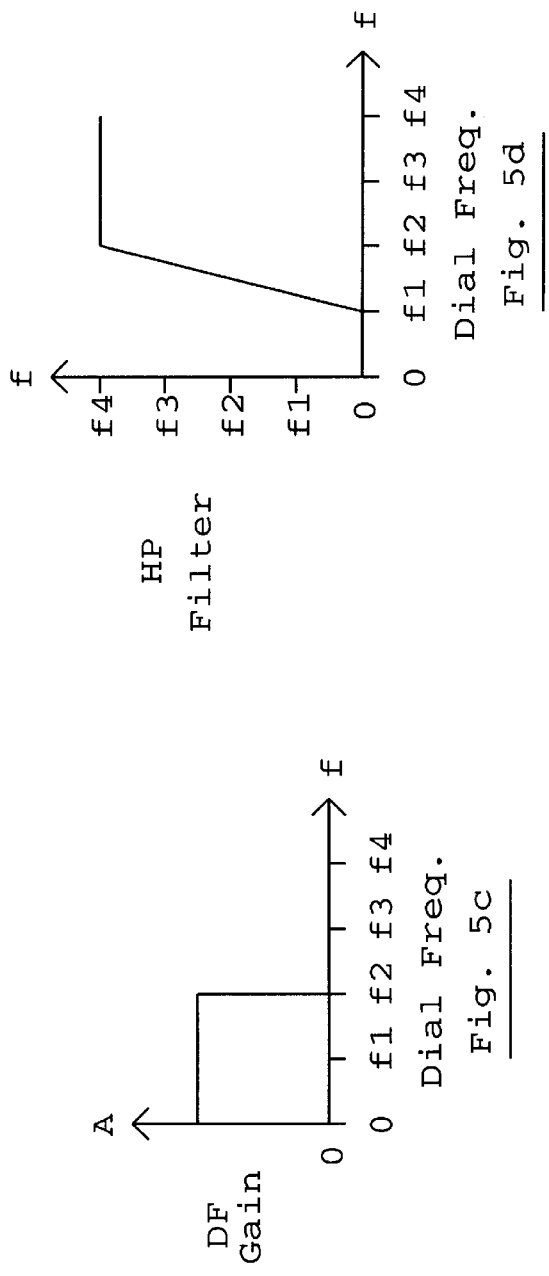

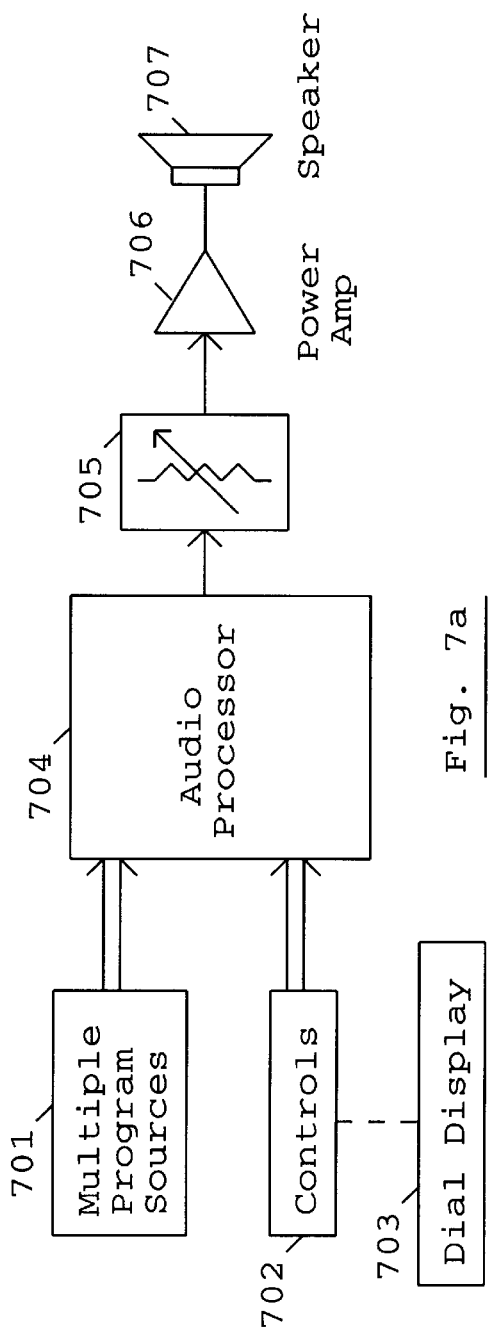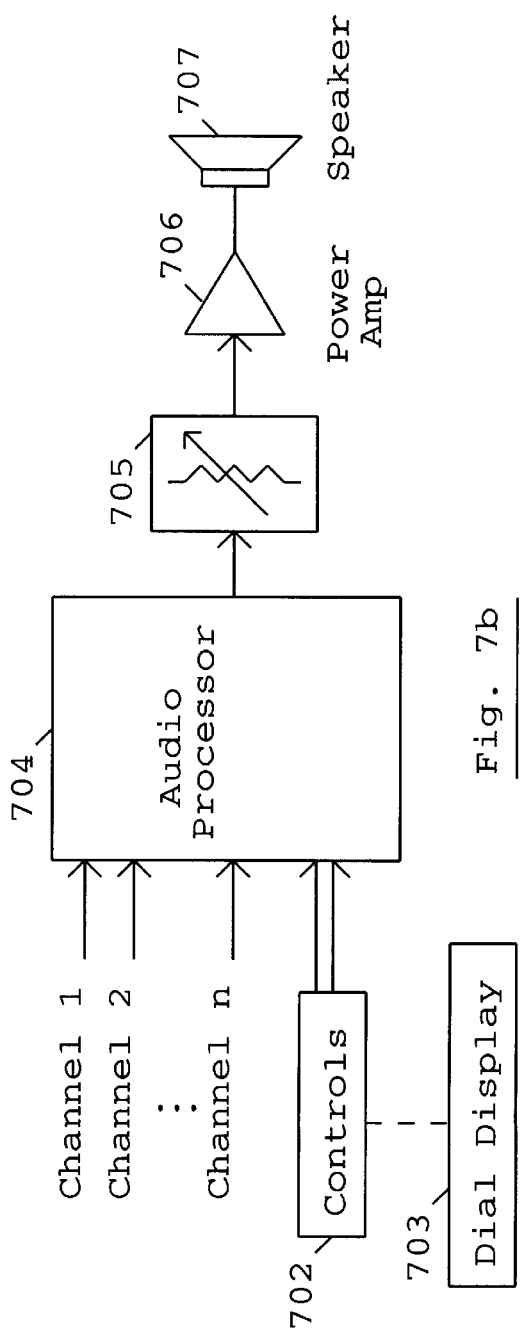

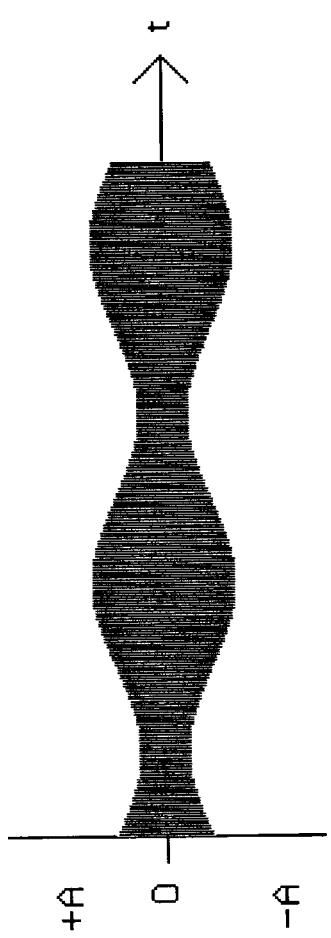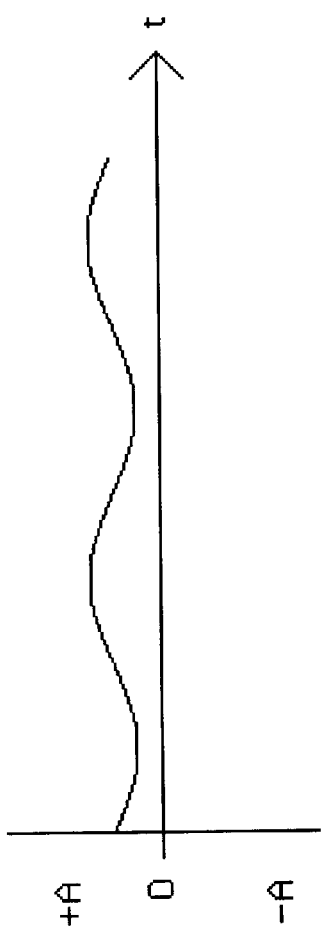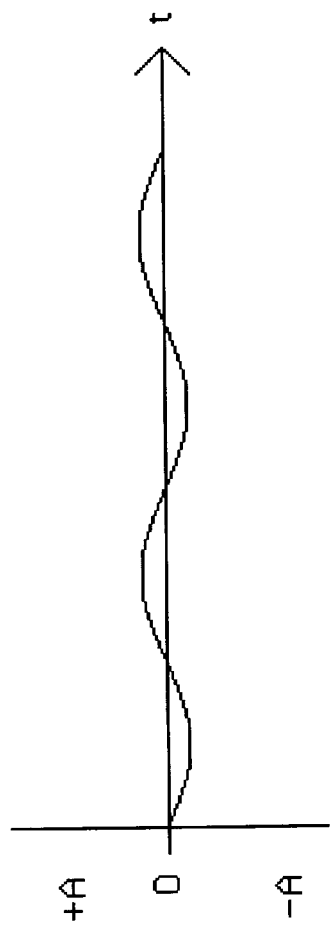

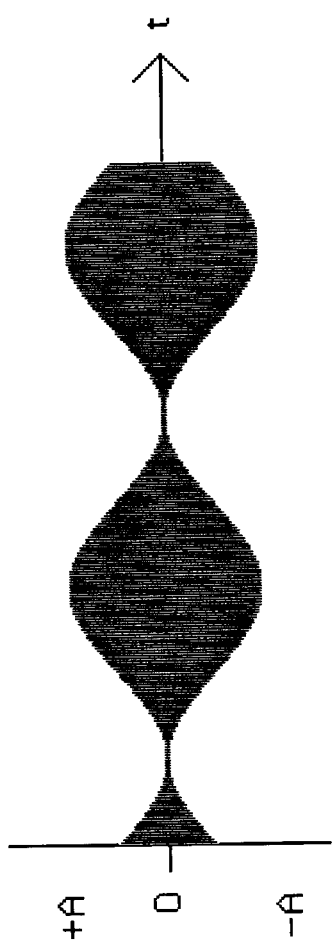
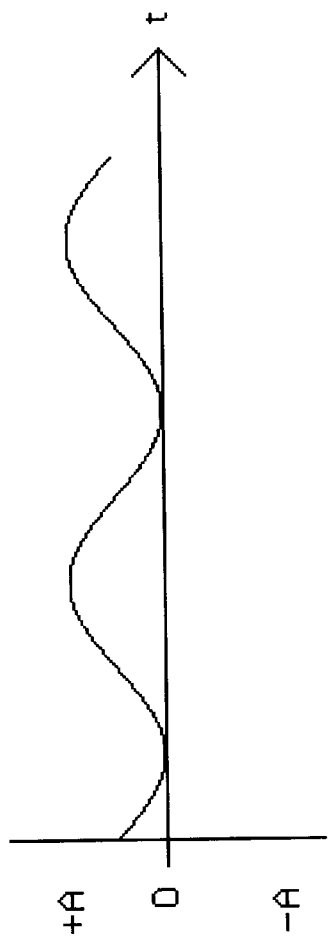
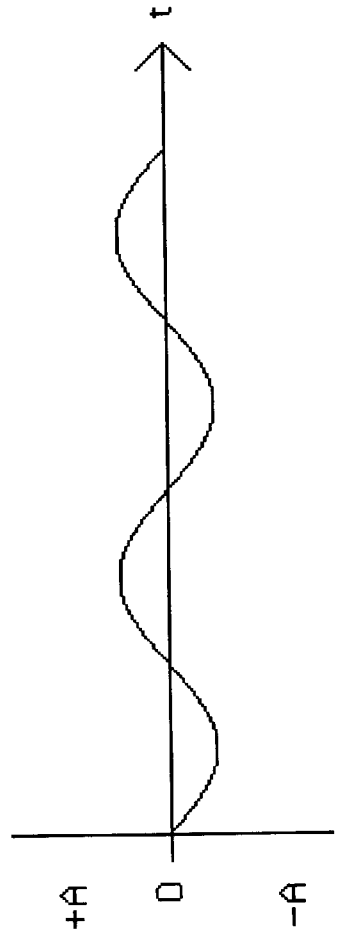

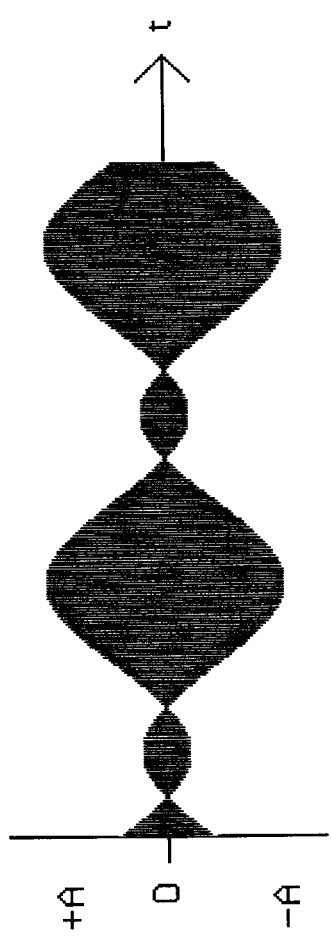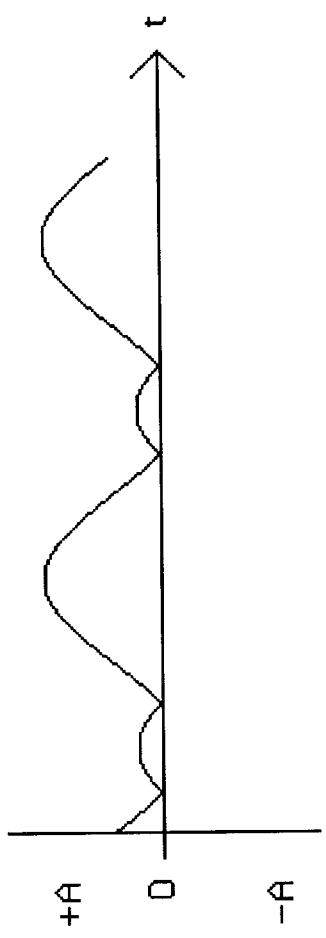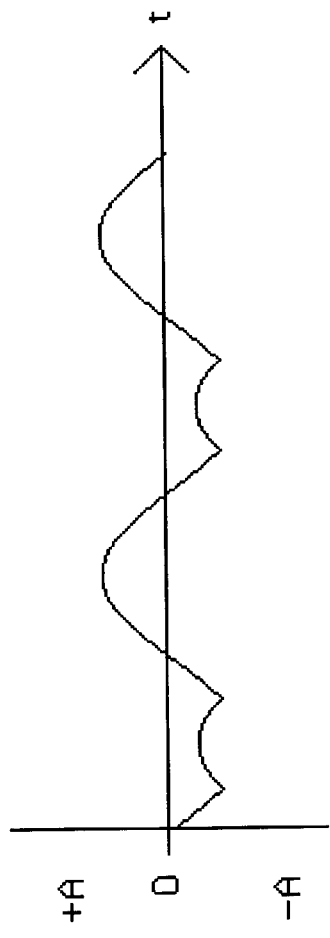

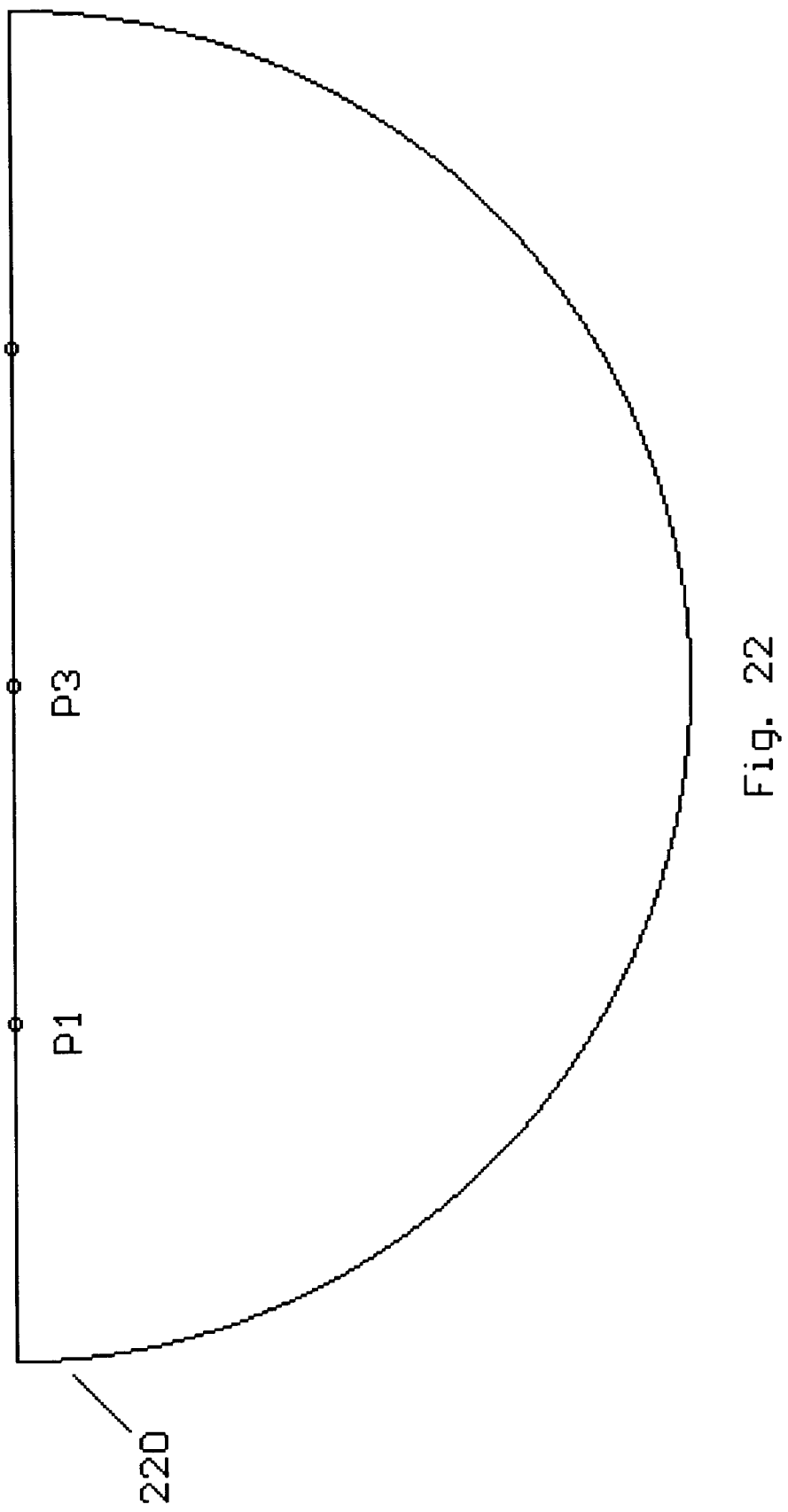

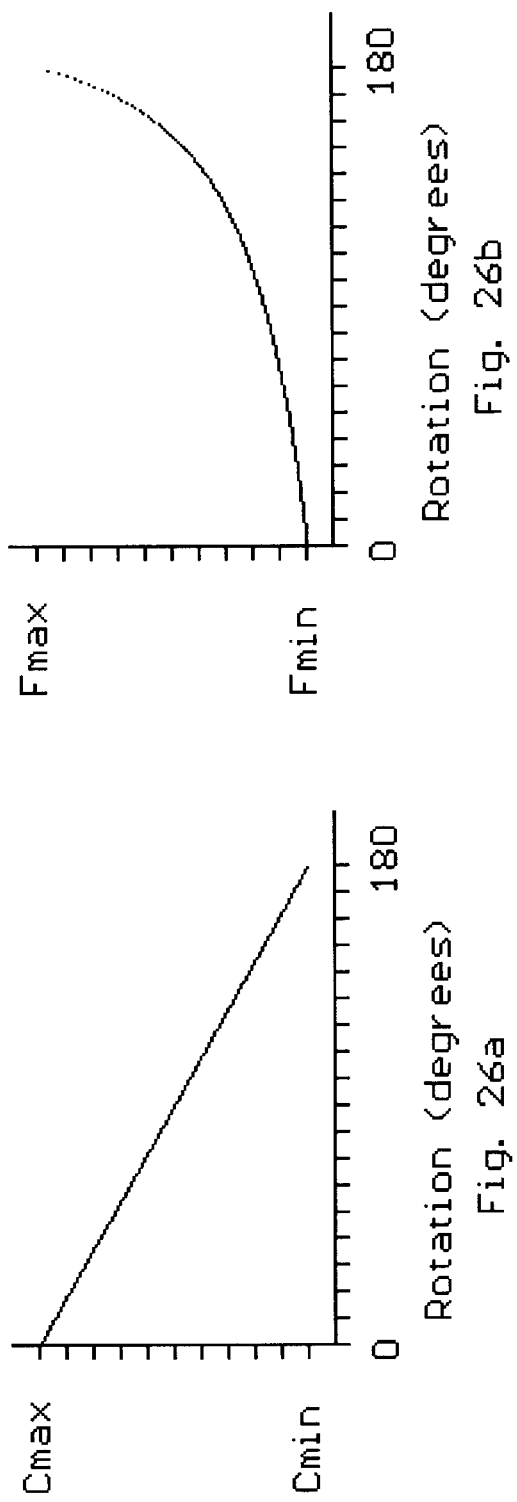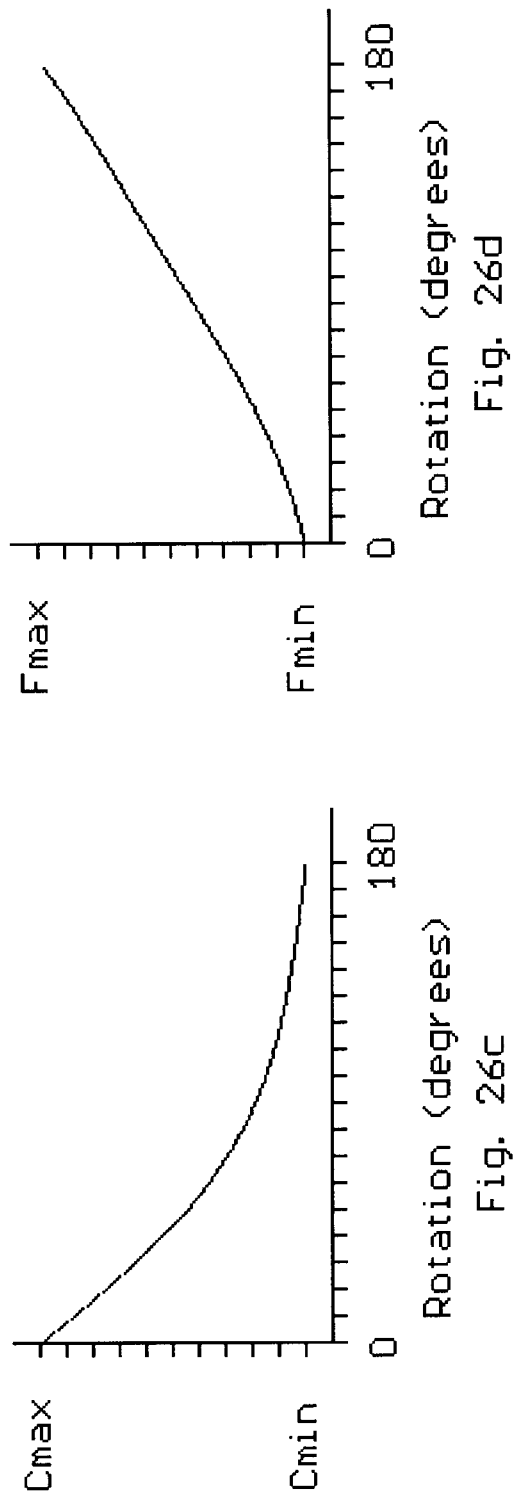

| 530 600 | 700 | 800 | | 1000 | | 1200 | | 1400 | | 1600 |
|---|---|---|---|---|---|---|---|---|---|---|
| — | — | — | — | — | — | — | — | — | — | — |
| 0 | 1 | 2 | 3 | 4 | 5 | 6 | 7 | 8 | 9 | 10 |

Fig. 27a Linear Dial

| 530 | 600 | 700 | 800 | 1000 | 1200 | 1400 1600 |
|---|---|---|---|---|---|---|
| — — | — | — | — | — | — | — — |
| 0 1 | 2 | 3 | 4 5 6 | 7 | 8 | 9 10 |

Fig. 27b Center Axis Capacitor

| 530 | 600 | 700 | 800 | 1000 | 1200 | 1400 | 1600 |
|---|---|---|---|---|---|---|---|
| — — | — | — | — — — | — | — | — | — |
| 0 1 | 2 | 3 | 4 5 6 | 7 | 8 | 9 | 10 |

Fig. 27c Offset Axis Capacitor

| 540 | 600 | 700 | 800 | 1000 | 1200 | 1400 | 1600 |
|---|---|---|---|---|---|---|---|
| — — | — | — | — — — | — | — | — | — |
| 0 1 | 2 | 3 | 4 5 6 | 7 | 8 | 9 | 10 |

Fig. 27d Marantz 2230

SIMULATED AM RADIO

FIELD OF THE INVENTION

This invention relates to the simulation of an AM radio and the simulated reception of AM radio signals.

BACKGROUND OF THE INVENTION

There are a number of people who collect Old AM Radios for a hobby. After going to the trouble and expense of obtaining an Old Radio, listening to modern radio programming on it tends to diminish the experience.

A considerable number of Old Radio Programs are available on cassette tape (and a lesser number are available on Compact Disc) from companies such as Radio Spirits, Inc. However, listening to the programs on a cassette player or a CD player also tends to diminish the experience.

Reproductions of Old Radios are available, many of which have built-in cassette players which can be used to listen to Old Radio Programs. An example is the Crosley CR32 Replica Cathedral Style AM/FM Radio Cassette available from QVC, Inc. This is an improvement over listening to modern radio programming on an Old Radio or listening to old Radio Programs on a modern cassette player but still falls short of the experience of tuning across the radio dial to listen to different stations.

Accordingly, one of the objects and advantages of my invention is to provide a more realistic illusion of listening to an actual AM radio by simulating the process of tuning across the radio dial where each station is playing a different program. The invention is especially suited to simulate the experience of listening to old Time Radio.

Further objects and advantages of my invention will become apparant from a consideration of the drawings and ensuing description.

SUMMARY OF THE INVENTION

A realistic illusion of listening to an actual AM radio is produced by providing a number of audio program signals and by simulating the process of tuning across the radio dial where each station is playing a different program. In a superheterodyne receiver using envelope detection, tuning a station off-channel results in a changing mixture of distortion and noise. The distortion function is caused by a variety of processes, among them being the filtering action as parts of the signal spectrum are cut off by the bandpass filter in the IF amplifier. Another is caused by the reduction in the carrier which causes the foldover of negative peaks in the envelope detector.

To simulate an AM radio, a real or simulated tuning control selects one of a number of audio programs and provides the distortion and noise functions as the tuning control tunes between audio program channels.

The simulated radio may be implemented on a computer with the image of the radio on a video display or a computer can be used along with a physical reproduction of a radio cabinet with tuning and volume controls, with the audio output to the speaker in the physical cabinet.

The simulated radio may be used to recreate the experience of listening to different eras of radio, with the radio image or radio cabinet reproduction done in the style of the era of radio being simulated. Programs may be the actual recordings of radio from a particular era or the programs may be recreated. The programs may be chosen to give a general feeling of the era or they may be of a specific day of particular interest. The method may also be used to provide a realistic radio in a driving simulator or a video game.

DESCRIPTION OF THE DRAWINGS

FIG. 5a shows a first Low-Pass Filter function for an audio program signal as a station is tuned away from the center frequency.

FIG. 5b shows a second Low-Pass Filter function for an audio program signal as a station is tuned away from the center frequency.

FIG. 5c shows a Digital Filter gain function as a station is tuned away from the center frequency.

FIG. 5d shows a High-Pass Filter function for an audio program signal as a station is tuned away from the center frequency.

FIG. 7a shows the general form of the invention.

FIG. 7b shows the general form of the invention with discrete channel inputs.

FIG. 18a shows a 50% modulated AM signal.

FIG. 18b shows a 50% modulated AM signal after envelope detection.

FIG. 18c shows a 50% modulated AM signal after envelope detection and with AC coupling.

FIG. 19a shows a 100% modulated AM signal.

FIG. 19b shows a 100% modulated AM signal after envelope detection.

FIG. 19c shows a 100% modulated AM signal after envelope detection and with AC coupling.

FIG. 20a shows a 150% modulated AM signal.

FIG. 20b shows a 150% modulated AM signal after envelope detection.

FIG. 20c shows a 150% modulated AM signal after envelope detection and with AC coupling.

FIG. 22 shows a rotor and a stator of a variable capacitor.

FIG. 26a shows the relationship of capacitance versus rotation angle for a variable capacitor with the axis of rotation located in the center of the rotor/stator midline.

FIG. 26b shows the relationship of frequency versus rotation angle for a variable capacitor with the axis of rotation located in the center of the rotor/stator midline.

FIG. 26c shows the relationship of capacitance versus rotation angle for a variable capacitor with the axis of rotation located with a particular offset from the center of the rotor/stator midline.

FIG. 26d shows the relationship of frequency versus rotation angle for a variable capacitor with the axis of rotation located with a particular offset from the center of the rotor/stator midline.

FIG. 27a shows a tuning dial with a linear frequency spacing.

FIG. 27b shows a tuning dial with the frequency spacing produced by a circuit using a variable capacitor with the axis of rotation located in the center of the rotor/stator midline.

FIG. 27c shows a tuning dial with the frequency spacing produced by a circuit using a variable capacitor with the axis of rotation located with a particular offset from the center of the rotor/stator midline.

FIG. 27d shows a tuning dial for a typical AM radio.

FIGS. 18a–18c, FIGS. 19a–19c, FIGS. 20a–20c, FIGS. 21a–21d, FIG. 22, FIG. 23, FIG. 24, FIG. 25, FIGS. 26a–26d, and FIGS. 27a–27d were generated by computer program. The screen images were captured and printed out.

DETAILED DESCRIPTION

In the following description, numerous specific details are set forth to provide a thorough understanding of the invention. However, it is understood that the invention may be practiced without these specific details. In other instances, well-known circuits, structures and techniques have not been shown in detail in order not to obscure the invention.

Introduction

The present invention simulates the behavior of an AM superheterodyne receiver, which has been the dominant AM receiver architecture since the late 1920s. We will start with the basic architecture of the superheterodyne.

Superheterodyne

Figure 13A:
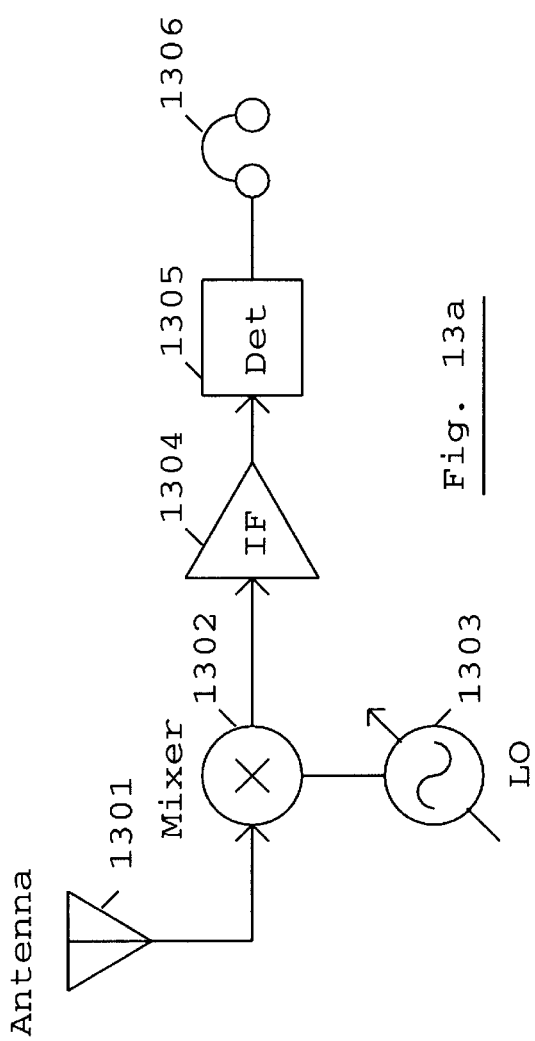
FIG. 13a shows a block diagram of Armstrong's original superheterodyne receiver.

The superheterodyne was invented by Edwin H. Armstrong. (U.S. Pat. No. 1,342,885 METHOD OF RECEIVING HIGH-FREQUENCY OSCILLATIONS issued Jun. 8, 1920 to Edwin H. Armstrong.) The architecture of Armstrong's receiver is shown in FIG. 13a. The broadcast signal is received by Antenna 1301 and multiplied in Mixer 1302 by the signal from Local Oscillator (LO) 1303. The resulting difference signal is amplified in Intermediate Amplifier (IF) 1304 and envelope detected in Detector 1305. The listener hears the demodulated signal in Headphone 1306 (referred to by Armstrong as a telephone). Note that Armstrong did not use an RF amplifier. The reason for this is that the triode vacuum tubes of the day were not capable of operating as amplifiers at the high frequencies (above 1 MHz.) which were Armstrong's goal. The parasitic capacitance between the plate and the grid caused amplifiers to oscillate when operated at high gain. (The higher the frequency, the greater the positive feedback through the parasitic capacitance.) By converting high incoming frequencies to a low frequency, Armstrong's method allowed IF Amplifier 1304 to operate at a frequency where triodes could be used at a much higher gain without oscillating. In addition, by tuning Local Oscillator 1303, all frequencies were converted to the same IF frequency so that IF Amplifier 1304 could be optimized to operate at a single frequency. This made it possible to tailor the gain and filter characteristics. Armstrong's '885 patent even teaches a double conversion superheterodyne receiver operating at 10 MHz.

Figure 13B:
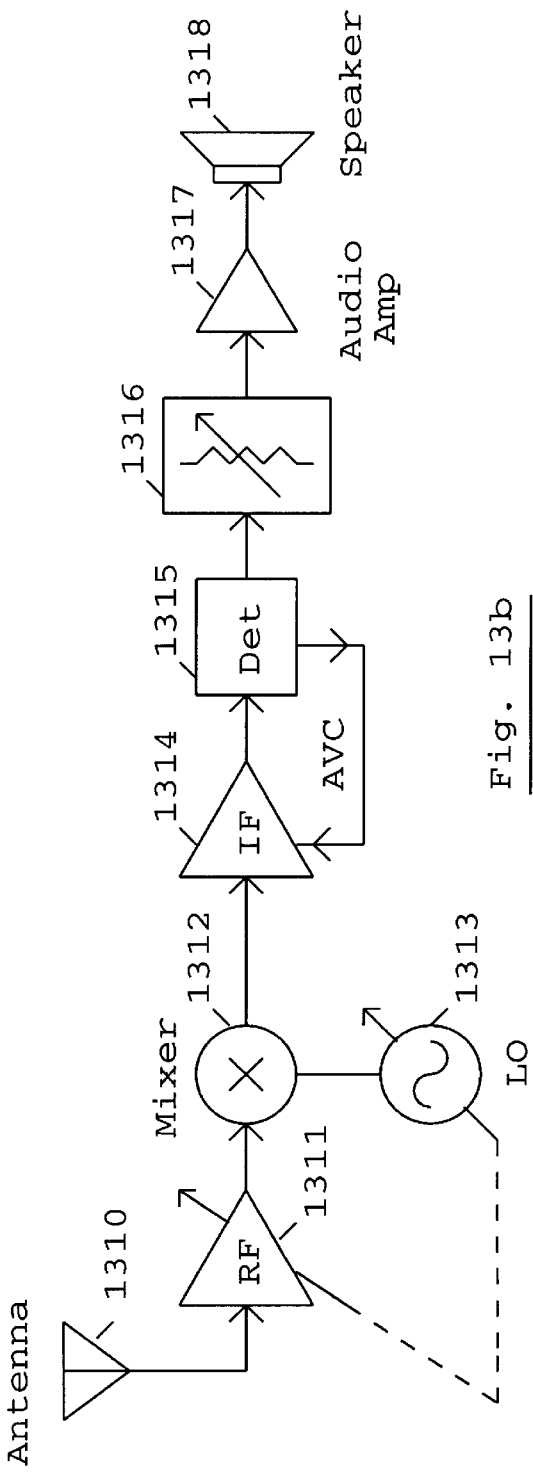
FIG. 13b shows a block diagram of a general superheterodyne receiver.

The architecture of the modern AM superheterodyne took form in the early 1930s and is shown in FIG. 13b. The broadcast signal is received by Antenna 1310, amplified by RF Amplifier 1311, and multiplied in Mixer 1312 by the signal from Local Oscillator (LO) 1313. The resulting difference signal from Mixer 1312 is amplified in Intermediate Amplifier (IF) 1314 and envelope detected in Detector 1315. The demodulated output from Detector 1315 then goes through Volume Control 1316, Audio Amplifier 1317, and finally to Speaker 1318. The improvements over the original Armstrong method include:

1. The addition of an RF Amplifier;
2. Having the frequency determining component in RF Amplifier 1311 (usually a variable capacitor) mechanically linked to the frequency determining component in Local Oscillator 1313 (also usually a variable capacitor) to permit single-knob tuning.
3. IF Amplifier 1314 and Detector 1315 contain a feedback control mechanism called the Automatic Volume Control (AVC). Because the signal levels from broadcast stations can vary over a very large range, the AVC attempts to make all signals the same level. This is so the user can tune across the dial without having to constantly readjust the volume control. The AVC has a time constant that is long enough that it does not respond to changing levels of program material, but short enough to respond to different signal levels when changing stations. Automatic Volume Control (AVC) is also called Automatic Gain Control (AGC).

Envelope Detection

An Amplitude Modulated (AM) signal can be represented by the equation:

$$y(t)=\sin(2*pi*fc(t))*(1+m*x(t))$$

where: fc(t) is the carrier wave at frequency fc x(t) is the modulation signal normalized to an amplitude of +/−1.0 m is the modulation index, 0<=m<=1.0

An example of an AM modulated signal, where a carrier is modulated by a sine wave with a modulation index of 50% (m=0.5), is shown in FIG. 18*a*. In this example x(t)=sin(2*pi*fm*t) where fm is the frequency of the modulating signal. Since the carrier frequency is much higher than the modulated signal the carrier appears as a solid shape. For example, where the carrier frequency is 800 KHz and the modulation signal is 400 Hz, there are 2000 carrier cycles for every modulation cycle. Note that the modulated signal is reflected around the Amplitude axis (A and −A). This is because the carrier wave is symmetrical around the amplitude axis, and the amplitude of the carrier wave sin(2*pi*fc(t)) at each instant in time is determined by the signal (1+m*x(t)). (This is why it is called amplitude modulation.)

Figure 14:
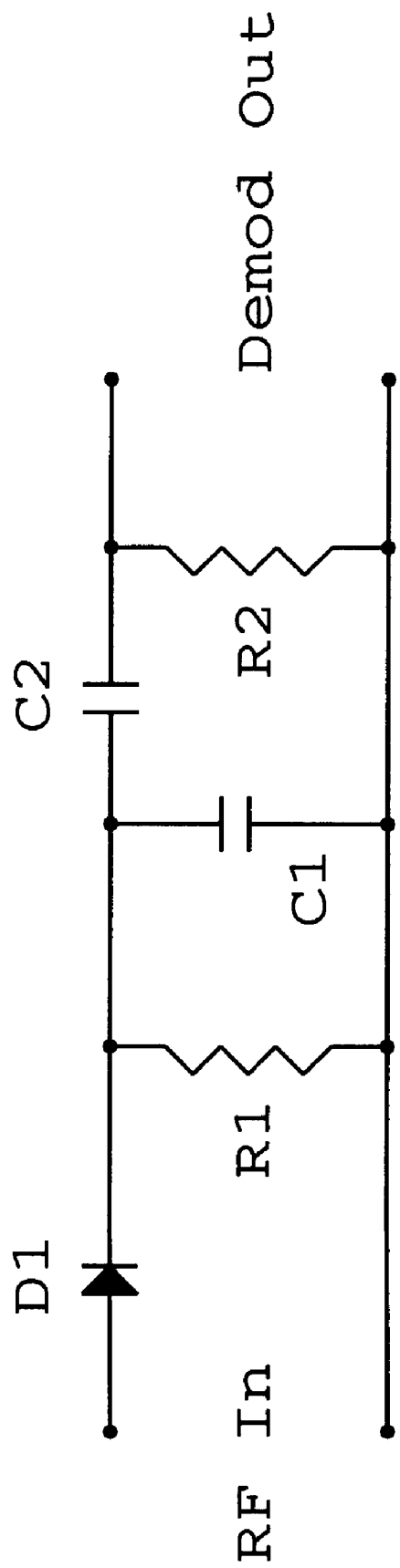
FIG. 14 shows the basic form of an envelope detector.

Although there are several methods for demodulating an AM signal, the simplest and most popular method is the envelope detector. The basic form of the envelope detector is shown in FIG. 14. Diode D1 passes positive voltages to charge capacitor C1. Resistor R1 discharges capacitor C1. The combination (R1,C1) acts as a lowpass filter with a time constant long compared to 1/fc but short compared to the time constant of the modulating signal. (We don't want to filter out the modulating signal.) If we start with the AM signal shown in FIG. 18*a*, the signal at (R1,C1) is shown in FIG. 18*b*. Note that this signal is the original signal (1+m*x(t)). The combination of (R2,C2) acts as a dc block to remove the bias of the unmodulated carrier component. The output of (R2,C2) is shown in FIG. 18*c* and shows the original modulating signal x(t)=sin(2*pi*fm*t).

Tuning Off-frequency

In an AM superheterodyne receiver, tuning away from the center frequency of a station typically results in the following sequence:

1. The audio becomes distorted;
2. The distorted audio becomes mixed with noise;
3. The audio becomes inaudible and,
   a) if the adjacent channel is not occupied by another station, only interstation noise is received;
   b) If the adjacent channel is occupied by another station, the reverse process occurs, namely that distorted audio from the adjacent station is mixed with noise, then distorted audio from the adjacent station is received, and finally the adjacent station becomes centered in the receiver's passband.

This process occurs whether the receiver is tuned above or below the center frequency.

There are several mechanisms that cause the above process to happen.

1. Frequency Selective Filtering

For the purpose of the following example, the IF passbands in FIGS. 15*a*–15*c*, FIGS. 16*a*–16*c*, and FIGS. 17*a*–17*c* are shown as having brickwall characteristics. In a real radio the edges would be more gradual.

There are two cases to consider. One is where the passband of the IF amplifier is the same or wider than the frequency spectrum of the transmitted signal. The other is where the passband of the IF amplifier is narrower than the frequency spectrum of the transmitted signal.

Although the frequency allocations of standard AM stations are based on a channel spacing of 10 KHz, stations are only required to limit the bandwidth of their signals greater than 10.2 KHz from the carrier frequency. From the Code of Federal Regulations, Title 47, Volume 4, Part 73, Revised as of Oct. 1, 1997, Sec. 73.44 "AM transmission system emission limitations":

"(a) The emissions of stations in the AM service shall be attenuated in accordance with the requirements specified in paragraph (b) of this section . . . "

"(b) Emissions 10.2 kHz to 20 kHz removed from the carrier must be attenuated at least 25 dB below the unmodulated carrier level, emissions 20 kHz to 30 kHz removed from the carrier must be attenuated at least 35 dB below the unmodulated carrier level, . . . "

Therefore, AM stations are permitted to occupy a channel bandwidth of 20.4 KHz, which allows the modulation signal to have a bandwidth of 10.2 KHz. Some AM broadcasters have taken great pride in transmitting a clean, hi-fidelity signal with 10 KHz audio. Others have not.

Figure 15A:
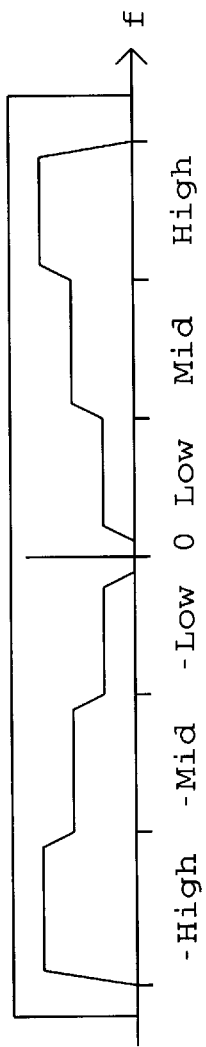
FIG. 15a shows an AM signal centered in a receiver's IF passband.

FIG. 15*a* shows a station centered in the IF passband where the station's transmitted bandwidth roughly matches the receiver's passband. An AM signal contains the carrier signal at the center frequency, an upper sideband, and a lower sideband. After demodulation the carrier signal becomes a DC component. The lower sideband is shown as a negative frequency. This actually means that the carrier phase is reversed. After demodulation the signals at negative frequencies are simply added to their respective signals at positive frequencies. Removing part of the spectrum at the negative frequencies changes the spectrum balance of the demodulated signal since the part of the lower spectrum that is not removed continues to add to the spectrum from positive frequencies. The modulation spectrum presented here is divided in Low, Middle, and High frequencies. The different amplitudes shown in the FIGS. 15*a*–15*c*, 16*a*–16*c*, and 17*a*–17*c* are simply to delineate the different frequency ranges.

Figure 15B:
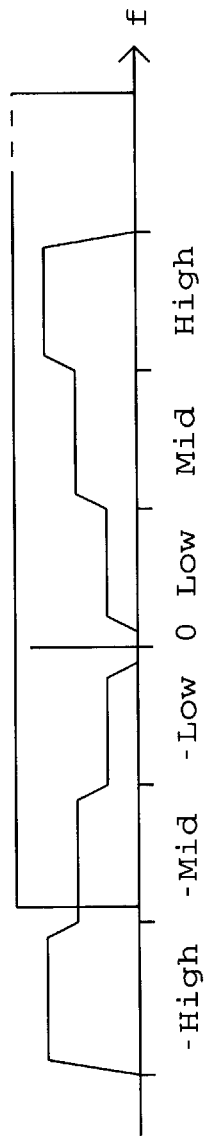
FIG. 15b shows an AM signal offset in a receiver's IF passband by a first frequency offset.
Figure 15C:
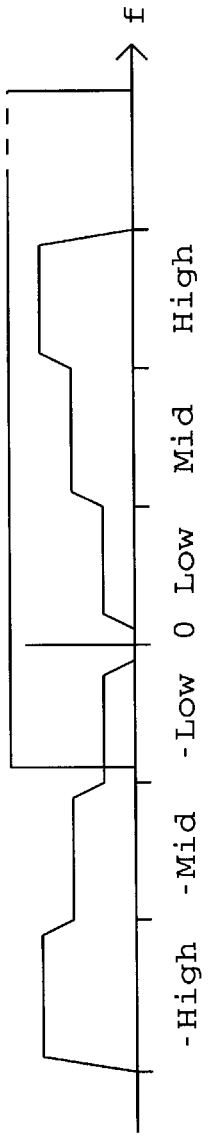
FIG. 15c shows an AM signal offset in a receiver's IF passband by a second frequency offset.

When the signal in FIG. 15*a* is tuned slightly off-frequency in FIG. 15*b*, The -High Frequencies are lost. The demodulated signal will simply lose half of the signal amplitude of the high frequencies. In FIG. 15*c*, as the station is tuned further off-frequency the signal loses both the -Middle and -High frequencies. Since the -Low frequencies are still present, the effect is to give a Low frequency boost to the signal.

Figure 16A:
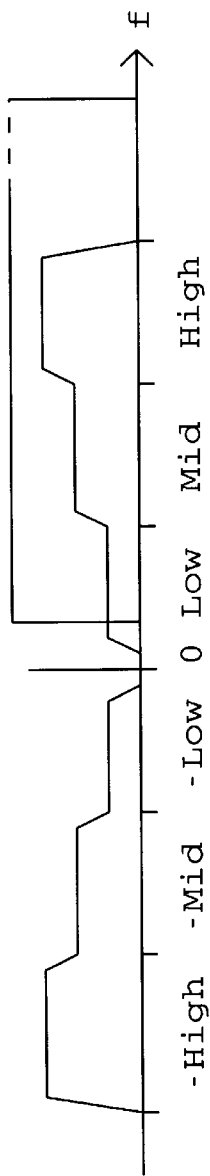
FIG. 16a shows an AM signal offset in a receiver's IF passband by a third frequency offset.
Figure 16B:
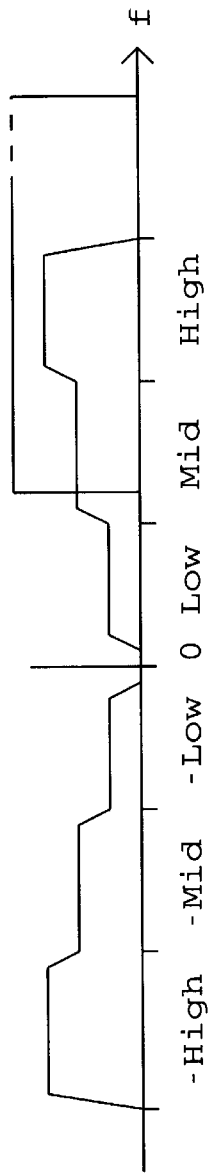
FIG. 16b shows an AM signal offset in a receiver's IF passband by a fourth frequency offset.
Figure 16C:
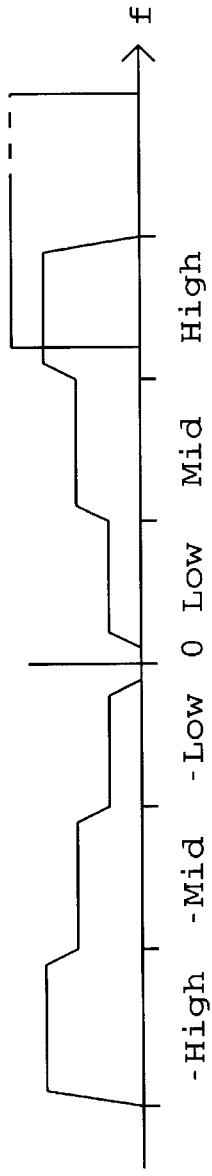
FIG. 16c shows an AM signal offset in a receiver's IF passband by a fifth frequency offset.

As we tune even more off-frequency (FIG. 16a), we lose all of the negative frequencies as well as the carrier signal. The loss of the carrier signal has a profound effect on the demodulation process as will be explained in the next section. In FIG. 16b we are left with only the Middle and High frequencies. In FIG. 16c we are left with only the High frequencies. Tuning even more off-frequency leads to oblivion (interstation noise) or the next station.

Figure 17A:
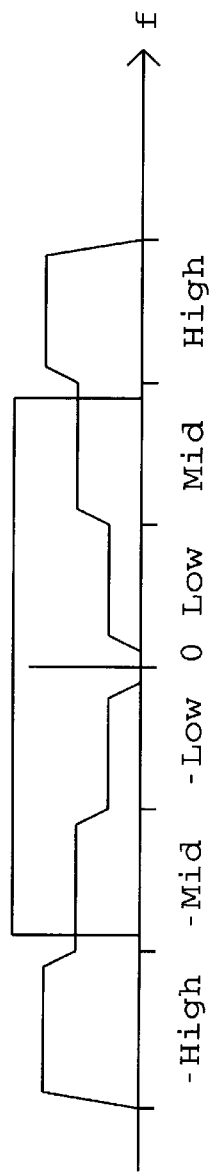
FIG. 17a shows an AM signal centered in a receiver's IF passband.
Figure 17B:
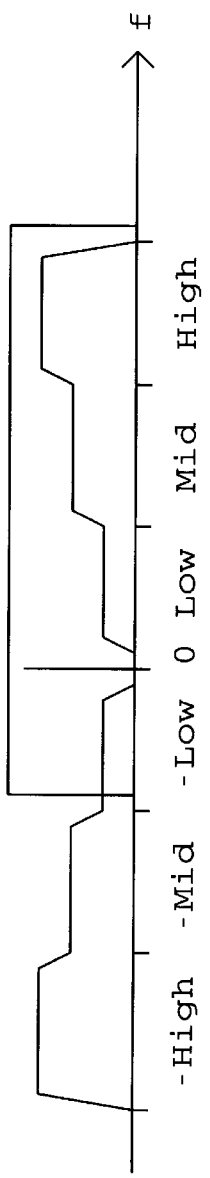
FIG. 17b shows an AM signal offset in a receiver's IF passband by a first frequency offset.
Figure 17C:
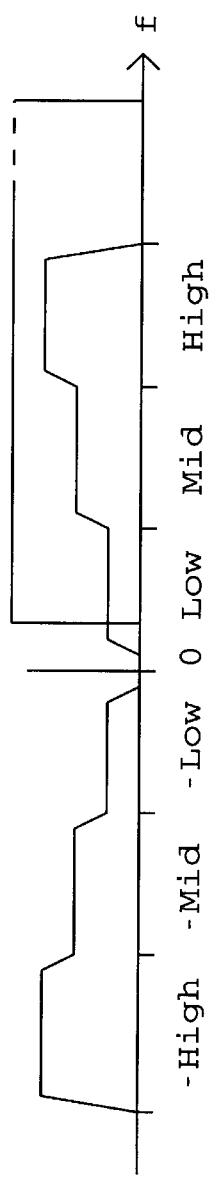
FIG. 17c shows an AM signal offset in a receiver's IF passband by a second frequency offset.

FIG. 17a shows a receiver bandwith that is less than that of the transmitted signal. Because both the -High and High frequencies are cut off by the receiver the demodulated signal remains balanced, albeit with the Highs absent. This may occur where a station broadcasts a hi-fidelity signal that is received on a low-fidelity receiver. As the receiver is tuned off-frequency in FIG. 17b we lose the -Mid frequencies and gain the High frequencies. The signal resulting from this imbalance would be considered as exhibiting "excessive brilliance." In FIG. 17c we have regained the correct tonal balance but have lost the carrier signal. After that would follow the same sequence as in FIG. 16b and FIG. 16c.

As the contributions from different parts of the frequency spectrum change, the Automatic Volume Control (AVC) attempts to maintain a uniform signal level.

2. Suppresion of Switching Carrier Frequency

As the switching carrier signal becomes suppressed, the modulation signal may become distorted. This is because as the switching carrier frequency is reduced in relationship to the modulated signal sidebands, the negative reflection of the modulated signal starts to fold over the amplitude axis. FIG. 19a shows an AM signal with 100% modulation. Envelope detection rectifies the signal and filters out the carrier as shown in FIG. 19b. AC coupling removes the DC offset and results in FIG. 19c. Reducing the carrier while maintaining the modulation sidebands results in the signal shown in FIG. 20a. Envelope detection rectifies the signal and filters out the carrier as shown in FIG. 20b. AC coupling removes the DC offset and results in FIG. 20c. Thus, suppression of the switching carrier signal may result in a distortion of the modulation signal.

In a radio with a really wide bandwidth such as the GE Superadio III (in the wide bandwidth mode) the detector is usually captured by the next station on the dial before carrier suppression occurs.

3. Noise Modulation

As noted above, as the station is tuned out of the IF passband the carrier signal becomes suppressed and tuning further away results in the modulation signals becoming attentuated, although the AVC increases the circuit gain. At some point the signal starts approaching the same signal level as the noise. The noise comes from several sources:

1. Noise picked up through the antenna which comes from both natural and manmade sources;
2. Electrical noise generated by devices connected to the power line and conducted by the power line to the radio.
3. Noise from the active devices in the radio. When the noise approaches the level of the modulation signal, the Mixer multiplies them together. By this point the carrier is already suppressed and the modulation signal is already distorted. Now it is distorted and noisy.

4. Dial Tuning

The dial of a typical radio tunes a frequency range of 530 KHz to 1600 KHz. For this example the range will be represented by 8192 dial units. To select 16 stations the dial position is divided by 512 (shift right 9 bits) This produces a station number in the range of 0–15. For maximum flexibility the station number is used to index a channel assignment table. This permits the assignment of any program channel to any station number as well as unoccupied channels containing interstation noise. A user supplied input is also accomodated. An example of a channel assignment table is shown in Table 1.

TABLE 1

| Station Number | Channel Assignment |
|---|---|
| 0 | Program 0 |
| 1 | Noise |
| 2 | Program 1 |
| 3 | Noise |
| 4 | Program 2 |
| 5 | Noise |
| 6 | Program 3 |
| 7 | User Input |
| 8 | Noise |
| 9 | Program 4 |
| 10 | Program 5 |
| 11 | Noise |
| 12 | Program 6 |
| 13 | Noise |
| 14 | Program 7 |
| 15 | Noise |

We now form the passband of the selected station by taking the original dial position and ANDing it with 0x01FF to leave the lower 9 bits to form the raw passband value. Therefore, the passband will be 512 units wide. Since the passband is equally divided into positive and negative frequencies with the zero frequency in the center, we subtract 256 from the raw passband value and take the absolute value. Thus, the absolute passband (or just passband) has a center frequency of zero and is a maximum of 256 units wide as the dial is tuned either above or below the center frequency.

Tuning Simulation

Method 1

The effects of tuning an AM superheterodyne receiver off-frequency can be produced by simulating the actual processes as described above.

Figure 2:
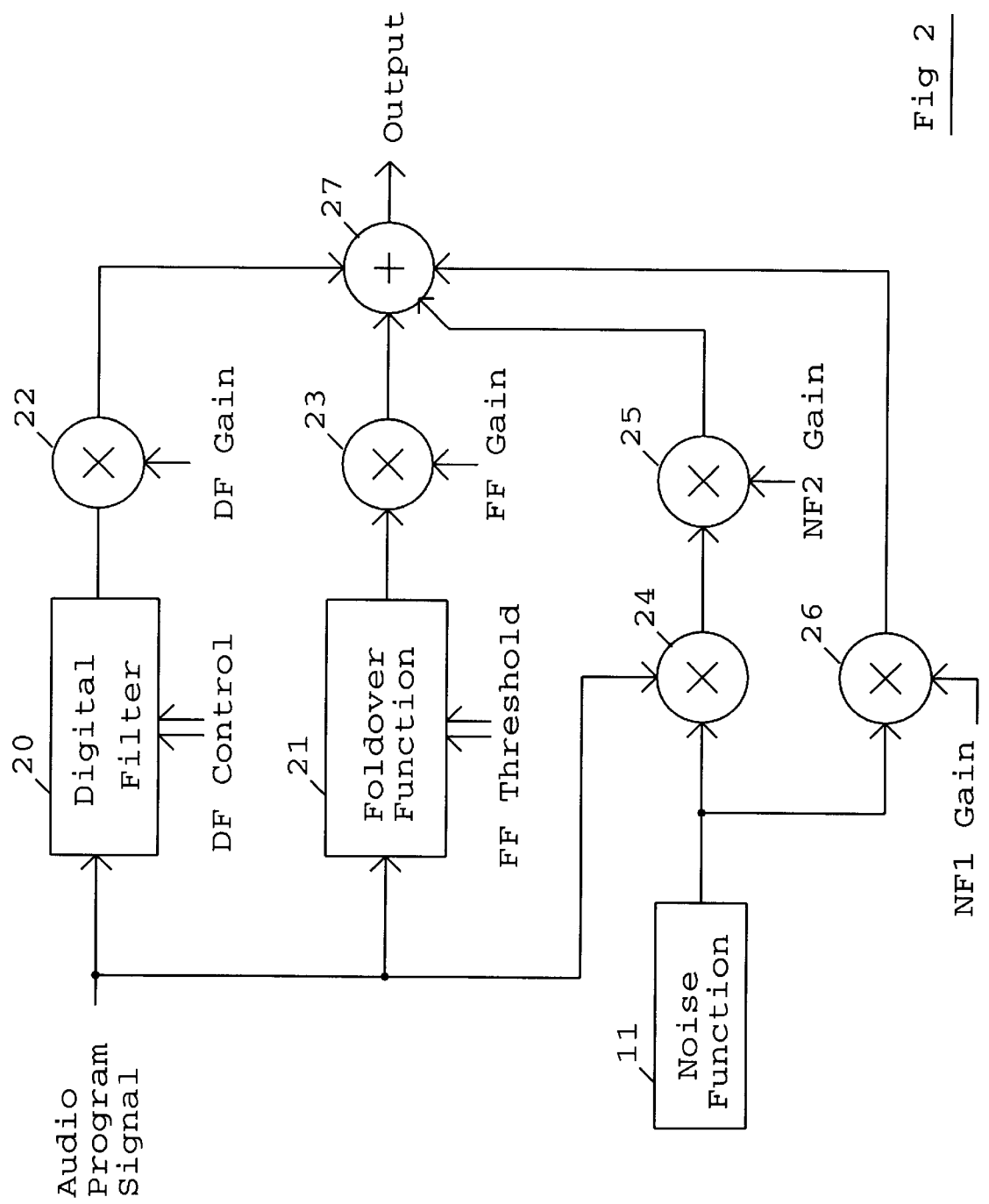
FIG. 2 shows a second method for simulating the process of tuning a station off-frequency.

Referring to FIG. 2, Digital Filter 20 is programmed as two Low Pass Filters with a common input and with summed outputs. The process of tuning the dial controls the frequencies of these filters to produce the required Frequency Selective Filtering. Digital Filter 20 may use standard forms such as Finite Impulse Response (FIR), Infinite Impulse Response (IIR), or Discrete Fourier Transforms (DFT) such as the Fast Fourier Transform (FFT). An example of a first Low Pass Filter function is shown in FIG. 5a. An example of a second Low Pass Filter Function is shown in FIG. 5b. An alternative to the use of two Low Pass Filter functions is the use of a single High Pass Filter function as shown in FIG. 5d. FIG. 5a, FIG. 5b, and FIG. 5d show the cutoff frequency of the respective filter as a function of the dial frequency. Multiplier 22 in FIG. 2 determines how much of the signal from Digital Filter 20 is to be mixed into the output of Adder 27. Multiplier 22 is usually incorporated within Digital Filter 20. The characteristics of a Digital Filter gain function is shown in FIG. 5c.

Figure 6A:
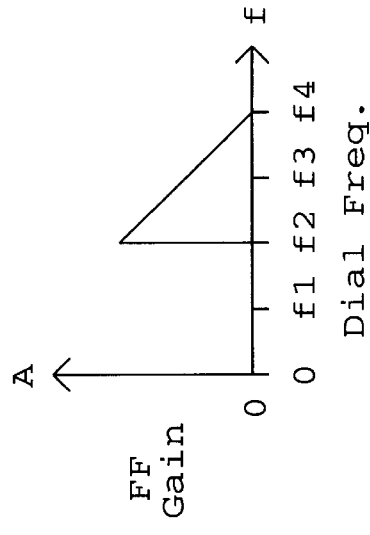
FIG. 6a shows a Foldover Function Threshold level function for an audio program signal as a station is tuned away from the center frequency.
Figure 6B:
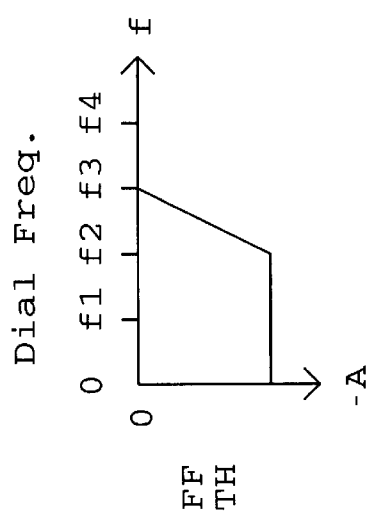
FIG. 6b shows a Foldover Function Gain function for an audio program signal as a station is tuned away from the center frequency.

At the appropriate dial frequency, Foldover Function 21 (FIG. 2) is brought into play which determines the amplitude at which the negative part of the signal folds over. (The effect of this can be seen in FIG. 20c.) An example of a Foldover Function Threshold control is shown in FIG. 6a. Multiplier 23 determines how much of Foldover Function 21 is to be mixed into the output of Adder 27. A Foldover Function Gain control is shown in FIG. 6b.

Figure 6C:
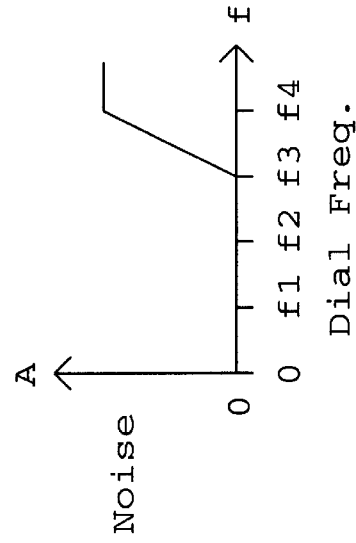
FIG. 6c shows a Noise Modulation gain function for an audio program signal as a station is tuned away from the center frequency.

At the appropriate dial tuning, Noise Function 11 in FIG. 2 modulates the Audio Program Signal. Noise Function 11 is multiplied by the Audio Program Signal in Multiplier 24. Multiplier 25 determines how much of the output of Multiplier 24 is to be mixed into the output of Adder 27. An example of a Noise-Modulated gain function (shown in FIG. 2 as 'NF2 Gain') is shown in FIG. 6c.

Figure 6D:
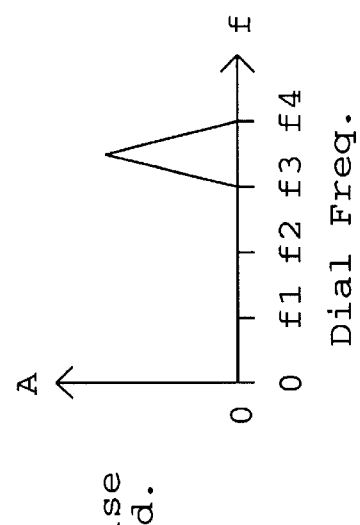
FIG. 6d shows a gain function for noise as a station is tuned away from the center frequency.

At the appropriate dial tuning, Noise Function 11 in FIG. 2 is used to add pure noise to the mix. Multiplier 26 determines how much of Noise Function 11 is to be mixed into the output of Adder 27. An example of a Noise gain function (shown in FIG. 2 as 'NF1 Gain') is shown in FIG. 6d. When the dial is tuned to an unoccupied channel Noise Function 11 is used directly to produce interstation pure noise.

The following example is for the case where the station is transmitting a high fidelity signal that is received by a radio with lower fidelity (as in FIG. 17a). Referring to FIG. 5a–FIG. 5c and to FIG. 6a–FIG. 6d, the dial frequencies below Dial Frequency f1 represent a deadzone where the station is received normally, with no distortion or noise. The first Low Pass Filter (FIG. 5a) represents the filtering action for the upper sideband, while the second Low Pass Filter (FIG. 5b) represents the filtering action for the lower sideband. Both Low Pass Filters limit the frequency response to frequency f3 which represents the middle frequencies. Thus, the frequencies above f3 are eliminated. From dial frequency f1 to dial frequency f2, LP Filter 1 expands the frequency response (more high frequencies), while LP Filter 2 reduces the frequency response. The middle frequencies go first, followed by the low frequencies. As dial frequency f2 is reached, the upper sideband represented by FIG. 5a is fully in the passband and the lower sideband represented by FIG. 5b is gone. Upon reaching reaching dial frequency f2 , the output of the Low Pass Filters is no longer used (see FIG. 5c) as the carrier starts to become suppressed and the signal begins to foldover (FIG. 6a and FIG. 6b). By dial frequency f3 the carrier is fully suppressed and signal foldover is fully engaged so that the signal is full-wave rectified (FIG. 6a). At dial frequency f3 the noise-modulated signal is introduced (FIG. 6c) as well as pure noise (FIG. 6d). By dial frequency f4, the noise-modulated signal has peaked and gone (FIG. 6c), leaving only pure noise (FIG. 6d). Dial frequency f4 represents the end of the channel. The next channel may be occupied, in which case the entire process is reversed, but with a new audio program signal. When the next channel is unoccupied, pure noise is selected.

As an alternative to the use of Digital Filter 20, both the first Low Pass Filter and the second Low Pass Filter can be implemented as adjustable frequency analog filters. They can also be implemented as switched capacitor filters which use a combination of digital and analog principles. In other words, any frequency adjustable filter can be used.

Method 2

Method 1 produces its results by precisely simulating the processes involved in tuning an AM superheterodyne receiver off-frequency. However, this method is computationally intensive. The method to be described is simpler and less computationally intensive and produces results that provide a realistic illusion of tuning an AM superheterodyne off-frequency.

As before, the dial position is converted to a station number which is used to index a channel assignment table (such as Table 1) to select a program channel. The dial position is also used to calculate the passband value which has a center frequency of zero and is a maximum of 256 units wide as the dial is tuned either above or below the center frequency.

Figure 1:
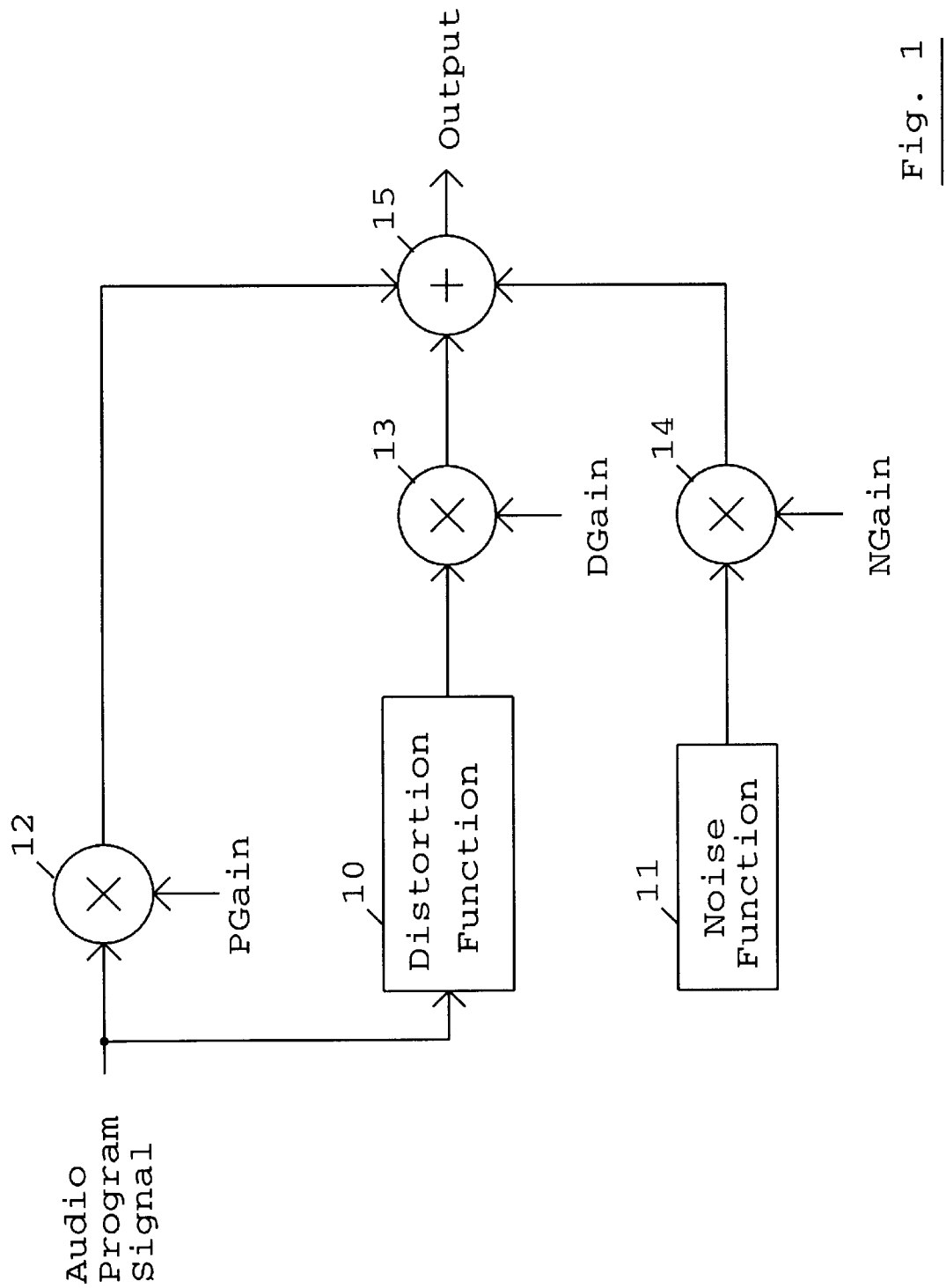
FIG. 1 shows a first method for simulating the process of tuning a station off-frequency.

Referring to FIG. 1, we will use three audio functions and three audio gain functions.

Figure 3A:
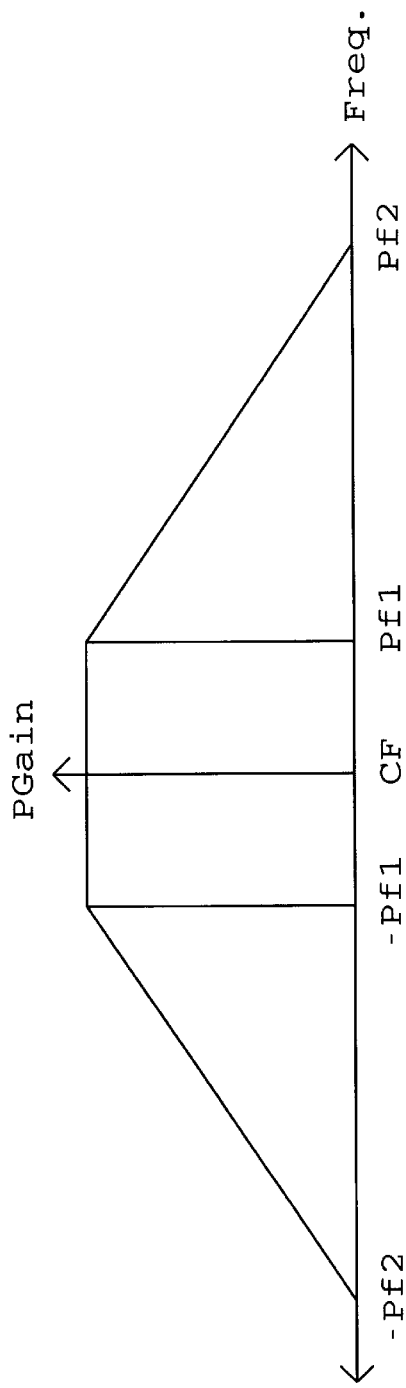
FIG. 3a shows a gain function for an audio program signal as a station is tuned away from the center frequency.
Figure 3B:
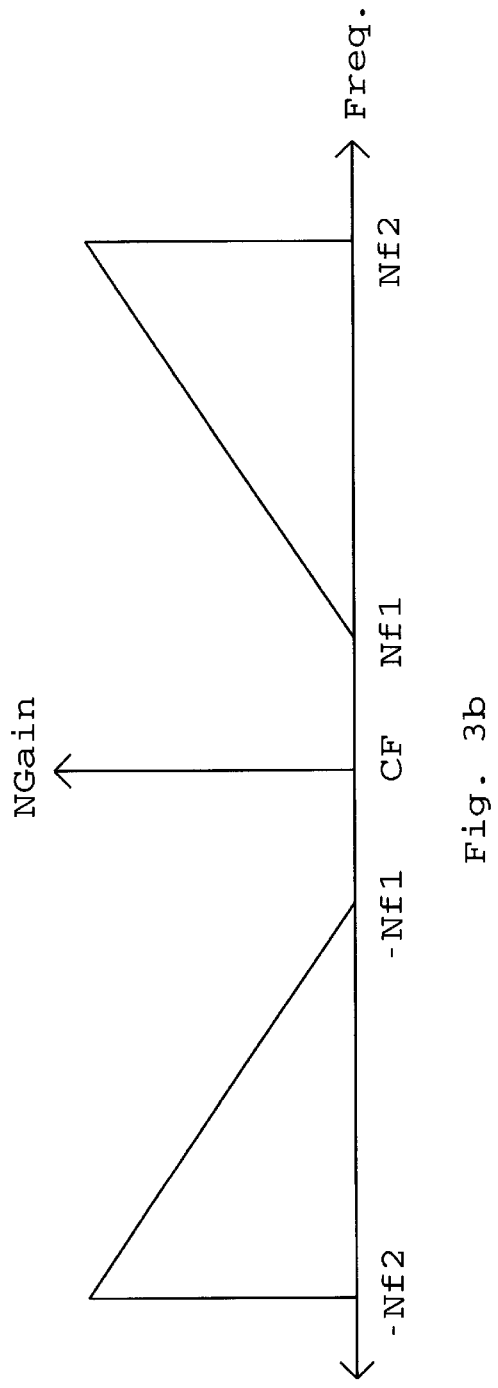
FIG. 3b shows a gain function for noise as a station is tuned away from the center frequency.
Figure 4A:
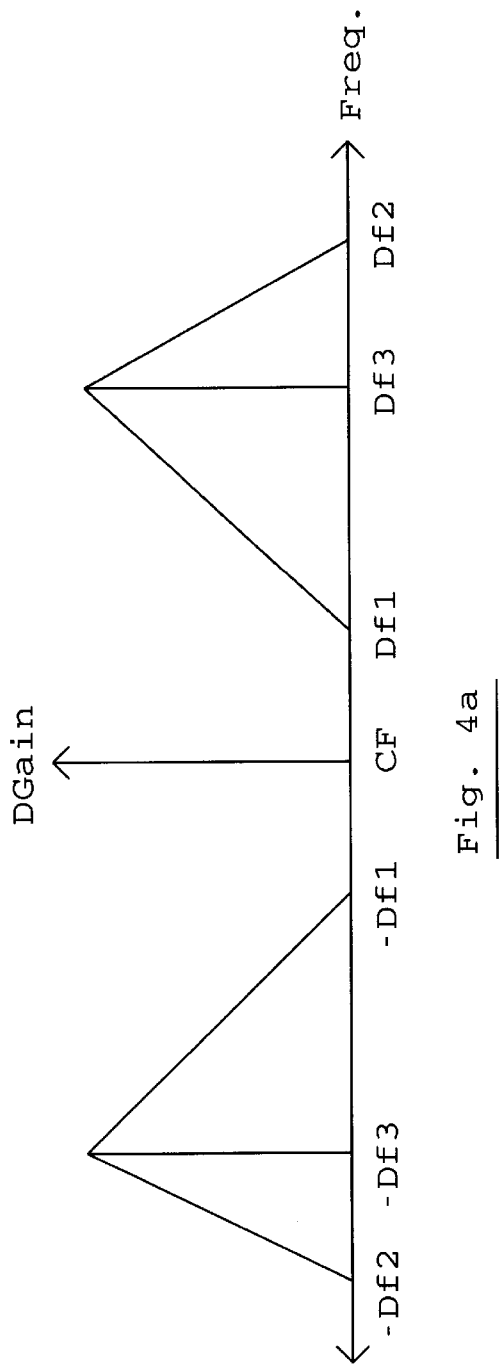
FIG. 4a shows a gain function for a distorted audio program signal as a station is tuned away from the center frequency.

The audio functions are:

1. The selected audio program signal which may contain stored program audio or audio supplied by the user;
2. A noise source (Noise Function 11), typically a pseudo-random number generator which may be produced by a variety of methods.
3. A distorted version of the selected audio channel (Distortion Function 10);

The audio gain functions are:

1. The PGain function which determines the amount of the undistorted selected audio program signal that will be present. Multiplier 12 determines how much of the audio program signal is to be mixed into the output of Adder 15. An example of a PGain function is shown in FIG. 3a.
2. The NGain function which determines the amount of noise that will be present. Multiplier 14 determines how much of Noise Function 11 is to be mixed into the output of Adder 15. An example of an NGain function is shown in FIG. 3b.
3. The DGain function which determines the amount of the distorted version of the selected audio program signal that will be present. Multiplier 13 determines how much of Distortion Function 10 is to be mixed into the output of Adder 15. An example of a DGain function is shown in FIG. 4a.

Figure 4B:
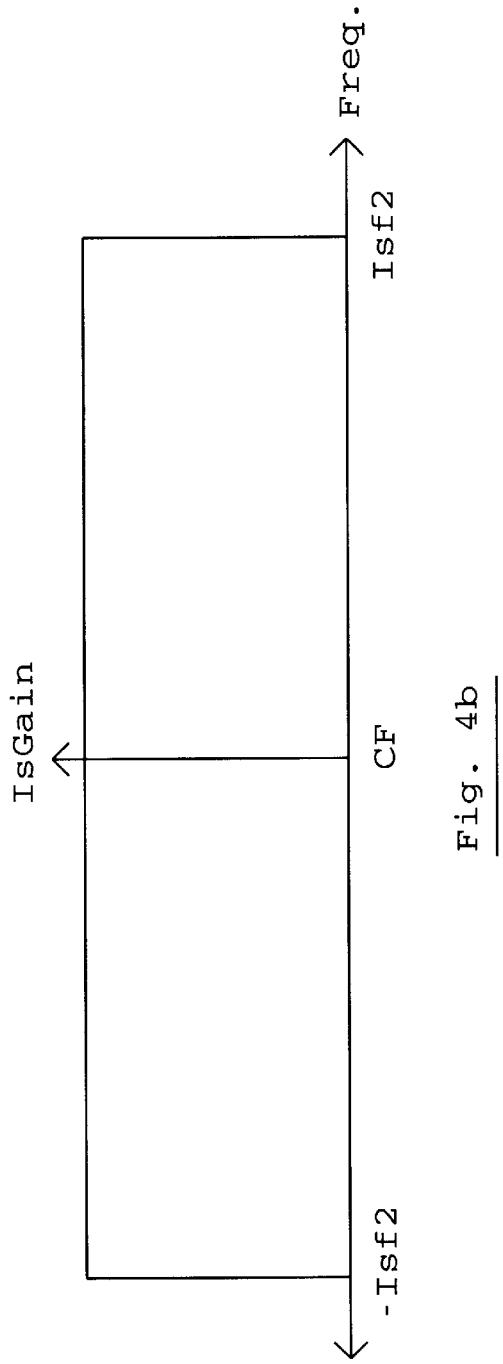
FIG. 4b shows a gain function for inter-station noise as a station is tuned away from the center frequency.

Interstation noise is typically uniform within a channel as shown in FIG. 4b.

Figure 21A:
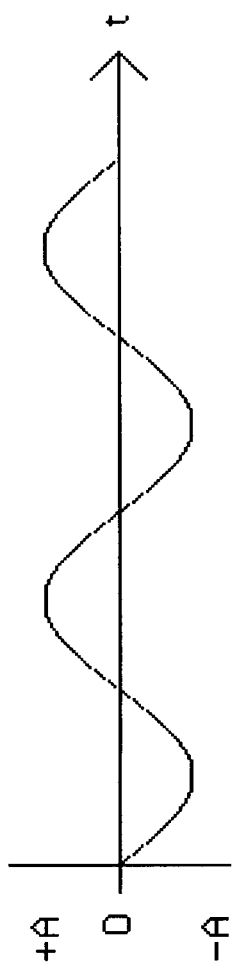
FIG. 21a shows a sine wave.
Figure 21B:
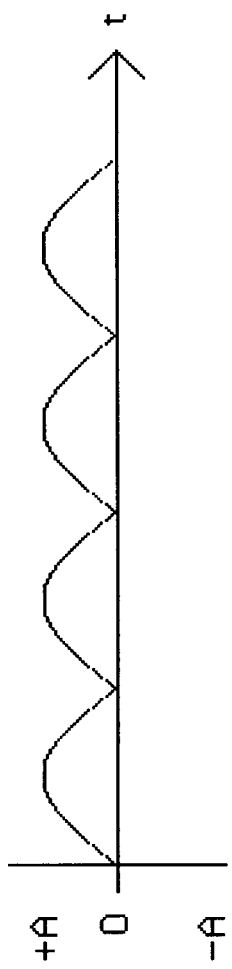
FIG. 21b shows a sine wave after full wave rectification.

An example of a pseudo-random number generator implemented as a Linear Feedback Shift Register using the C programming language is shown in Table 2. A sample output is shown in FIG. 21d.

TABLE 2

```
// Linear Feedback Shift Register
// Taps are at stages 3 and 31 (d2 and d30)
// Returns 16 bit result
int lfsr( )
{
    static long sreg = 0;
    long val;
    if ((sreg & 0X40000004L) == 0x40000004L) {val = 1;}
    if ((sreg & 0X40000004L) == 0x00000000L) {val = 1;}
    if ((sreg & 0X40000004L) == 0x00000004L) {val = 0;}
    if ((sreg & 0X40000004L) == 0x40000000L) {val = 0;}
    sreg = (sreg<<1) | val;
    return(sreg&0xFFFF);
}
```

Figure 21C:
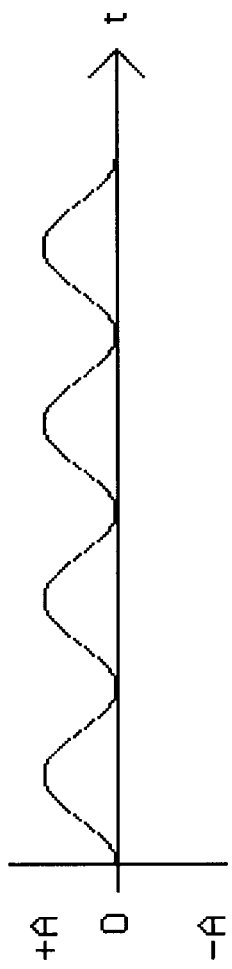
FIG. 21c shows a sine wave after its amplitude is squared.
Figure 21D:
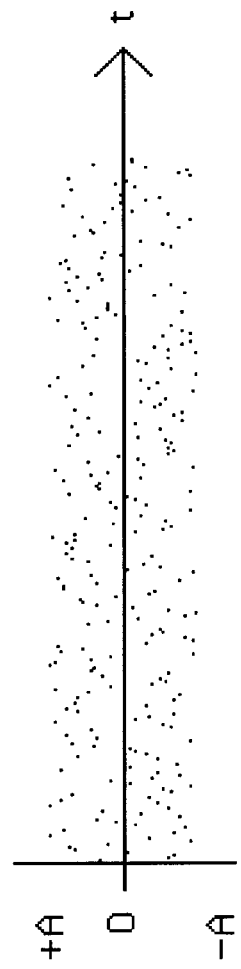
FIG. 21d shows pseudo-random noise.

There are several techniques that may be used to produce a distorted version of the selected audio channel. One method is full wave rectification. The sine wave in FIG. 21a is full-wave rectified and shown in FIG. 21b. Another method is to calculate the square of the waveform. The sine wave in FIG. 21a is squared and shown in FIG. 21c. Note that since $$\sin(a)*\sin(b) = 1/2*\cos(a-b) - 1/2*\cos(a+b)$$

$$\sin(a)*\sin(a) = 1/2*\cos(a-a) - 1/2*\cos(a+a)$$

$$= 1/2*\cos(0) - 1/2*\cos(2a)$$

$$= 1/2*1 - 1/2*\cos(2a)$$

$$= 1/2*(1 - \cos(2a))$$

the waveform in FIG. 21c is a cosine wave at twice the frequency of the input sine wave. (A non-sinusoidal wave, after being squared, will not usually be as pretty.)

As a further refinement, more than one Distortion Function may be used, each with its own Distortion Gain Function.

Because of its simplicity and lower processing requirements, Method 2 is the preferred embodiment.

Method 3

Figure 12A:
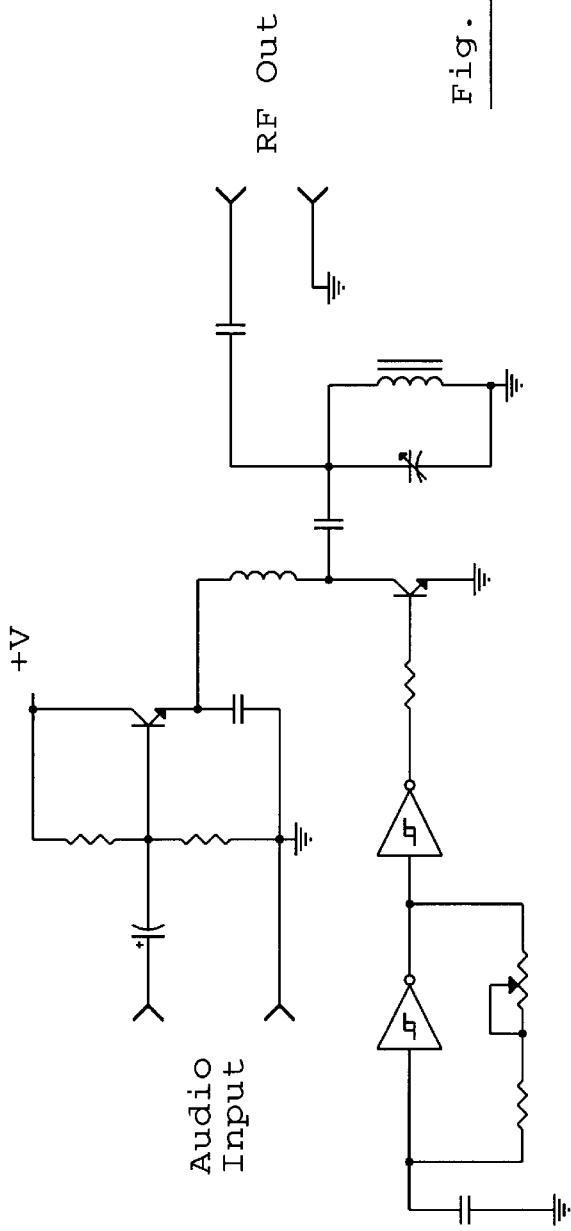
FIG. 12a shows a simple modulated RF generator.
Figure 12B:
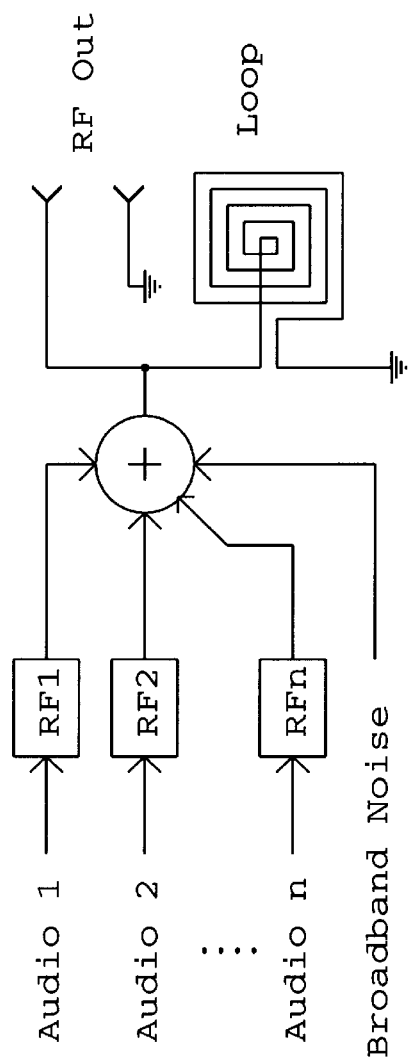
FIG. 12b shows the basic form for the non-invasive method.

This is to allow owners of actual radios (especially old radios) to experience the benefits of this invention without modifying their radios. In this method, there are a number of audio program sources, coming for example from Digital Mass Program Storage, each of which is connected to its own modulated RF Generator. Referring to FIG. 12b, the outputs of the RF Generators are summed together and either connected directly to the antenna terminals of the target radio or, if the radio does not have an external antenna input, a loop antenna is placed near the radio. As long as the signals from the RF Generators are of sufficient strength they will overpower any signals picked up by the radio's internal antenna. Since there are only a discrete number of RF Generators, the spectrum between stations is filled in by broadband noise. An example of a simple modulated RF Generator is shown in FIG. 12a. In addition to being a non-invasive technique, the process of tuning a station off-frequency is supplied by the radio itself.

Method 4

A method to allow owners of actual radios to experience the benefits of this invention that is only slightly invasive requires making connections to the radio's Local Oscillator and to the radio's Intermediate Frequency Amplifier. The frequency of the signal from the Local Oscillator is measured, such as with either a frequency counting circuit or a frequency-to-voltage converter followed by an A/D Converter, to provide the position of the tuning dial. After using Method 1 or Method 2 as described above, the audio output is modulated onto an RF carrier at the IF frequency. This signal is then fed into the radio's IF Amplifier at a signal strength that overpowers the signal that may be produced by the radio's RF section. The signal thus injected into the radio's IF Amplifier is demodulated, amplified, and sent to the radio's speaker. It thereby also makes use of the radio's Volume Control.

ARCHITECTURE OF THE INVENTION

The basic form of the invention is shown in FIG. 7a. Controls 702 selects the station and determines the station's position in the passband. Dial Display 703 is linked to Controls 702 to provide a visual indication of the dial position. Audio Processor 704 receives the station selection from Controls 702 and uses it to select the program from Multiple Program Sources 701. Audio Processor 704 also receives from Controls 702 the position of the station in the passband and uses it to process the selected program source. The resulting audio then goes through Volume Control 705, Power Amplifier 706, and finally to Speaker 707. Multiple Program Sources 701 may comprise mass digital storage such as a CD-ROM, a DVD-ROM, a Digital Audio Tape (DAT), a digital bit stream from a computer network, a multitrack analog magnetic tape machine, or discrete audio sources. Audio Processor 704 may process the audio signal using digital methods, analog methods, or a combination of digital and analog methods. Regardless of the method of program audio storage (or delivery), one or more sources may be provided by the user in real-time such as a cassette player, CD Player, or microphone.

In FIG. 7b the Multiple Program Sources are shown as discrete audio sources.

Figure 8:
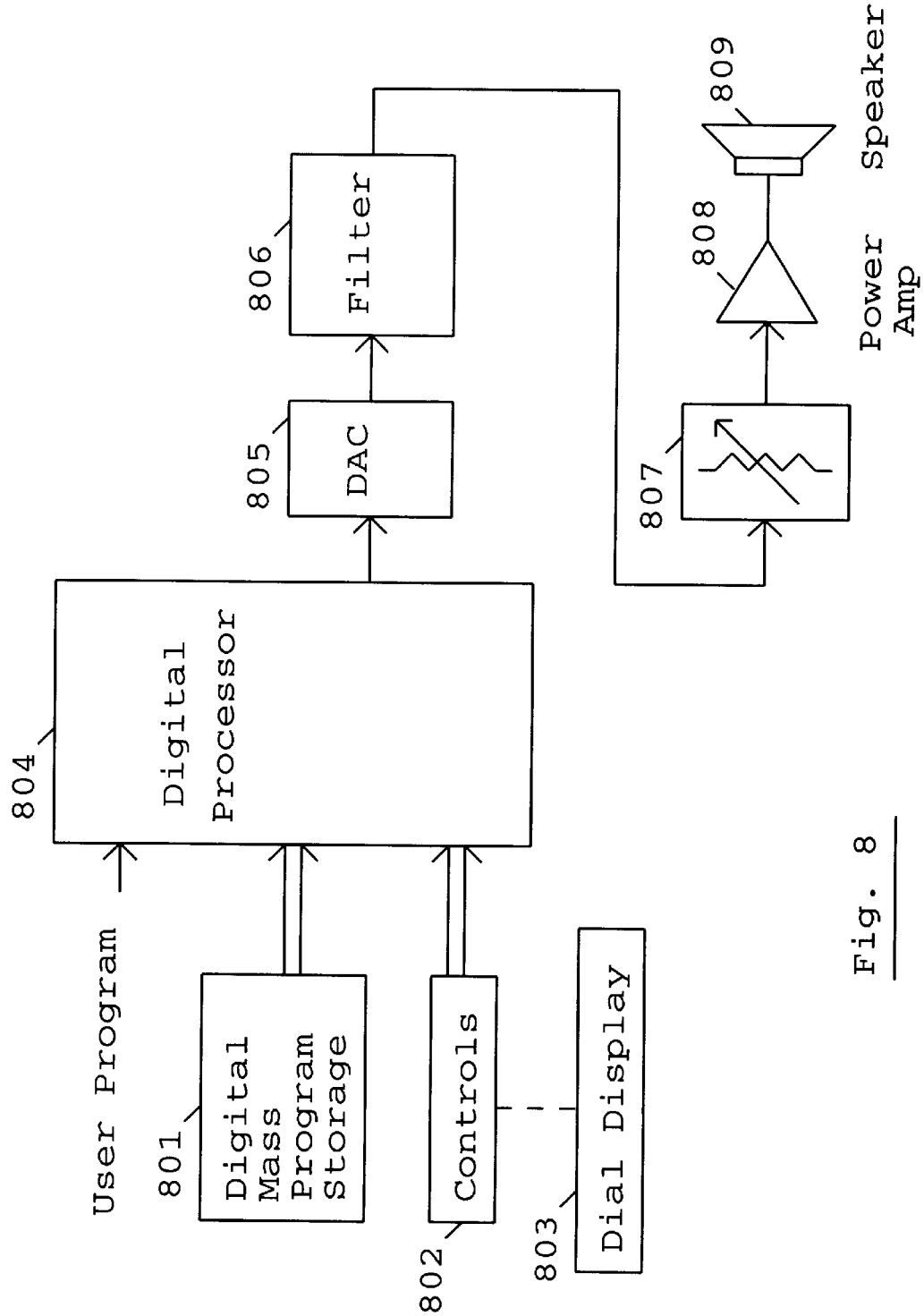
FIG. 8 shows the general form of the invention using digital technology.

A more specific form of the invention is shown in FIG. 8. Controls 802 selects the station and determines the station's position in the passband. Dial Display 803 is linked to Controls 802 to provide a visual indication of the dial position. Digital Processor 804 receives the station selection from Controls 802 and uses it to select the program from Digital Mass Program Storage 801. Digital Processor 804 also receives from Controls 802 the position of the station in the passband and uses it to process the selected program source. The resulting digital output is converted to an analog signal by Digital-to-Analog Converter (DAC) 805. The output from DAC 805 is filtered by Filter 806 to remove digital artifacts and then goes through Volume Control 807, Power Amplifier 808, and finally to Speaker 809. Digital Processor 804 may be a Personal Computer, a Digital Signal Processor (DSP), or another type of embedded processor. In addition, one or more audio program sources may be provided by the user in real-time. Controls 802, Dial Display 803, Volume Control 807, Power Amplifier 808, and Speaker 809 may be contained in a physical cabinet which is a reproduction of an actual radio cabinet. The cabinet may also be of new design.

Figure 9:
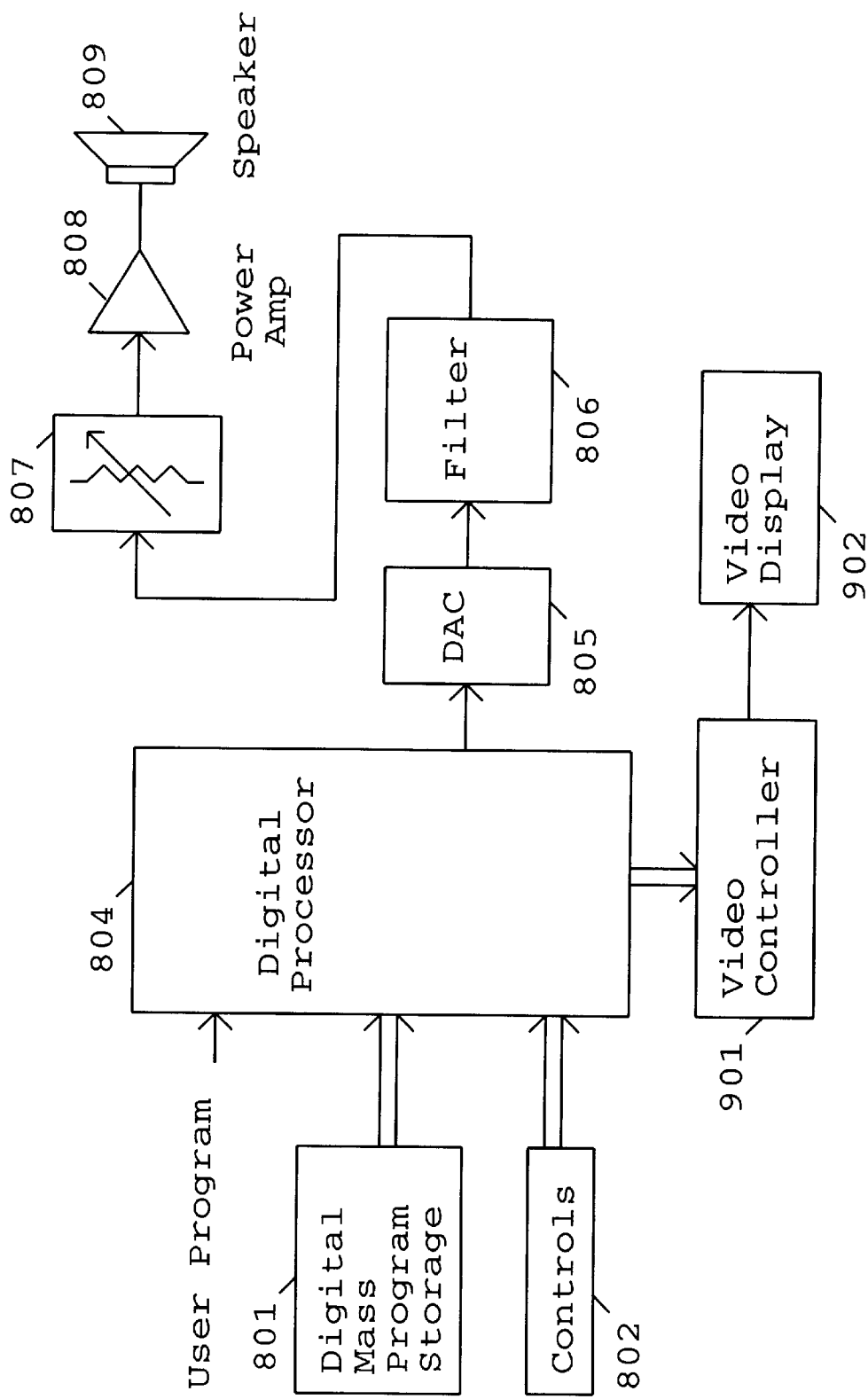
FIG. 9 shows the general form of the invention using digital technology where the simulated radio is displayed on a video display.

In FIG. 9 the simulated radio is displayed on Video Display 902. The video signal is produced by Video Controller 901. Digital Processor 804 may be a standard Personal Computer. Digital Mass Program Storage 801 may be a CD-ROM drive, a DVD-ROM drive, a Digital Audio Tape (DAT) drive, or a Hard Disk drive. Controls 802 may be keyboard inputs, a computer mouse, a joystick, or other peripheral. Digital Processor 804 also contains a standard Sound Card which includes DAC 805 and Filter 806. A standard Amplified Speaker may contain Volume Control 807, Power Amplifier 808, and Speaker 809. The user may select from a variety of different radios to be displayed. When the selected radio is a clock radio, the clock can be programmed to indicate the actual time during which the selected program was originally broadcast. The Video Display may also present additional information to the user such as the history of the radio being displayed or information concerning the program currently being played.

An alternative to a Personal Computer is one of the several Video Game Consoles, such as the Sony PlayStation, which comes equipped with a CD-ROM drive, has sound reproduction capabilities, and produces video to be displayed on a standard television.

Figure 10:
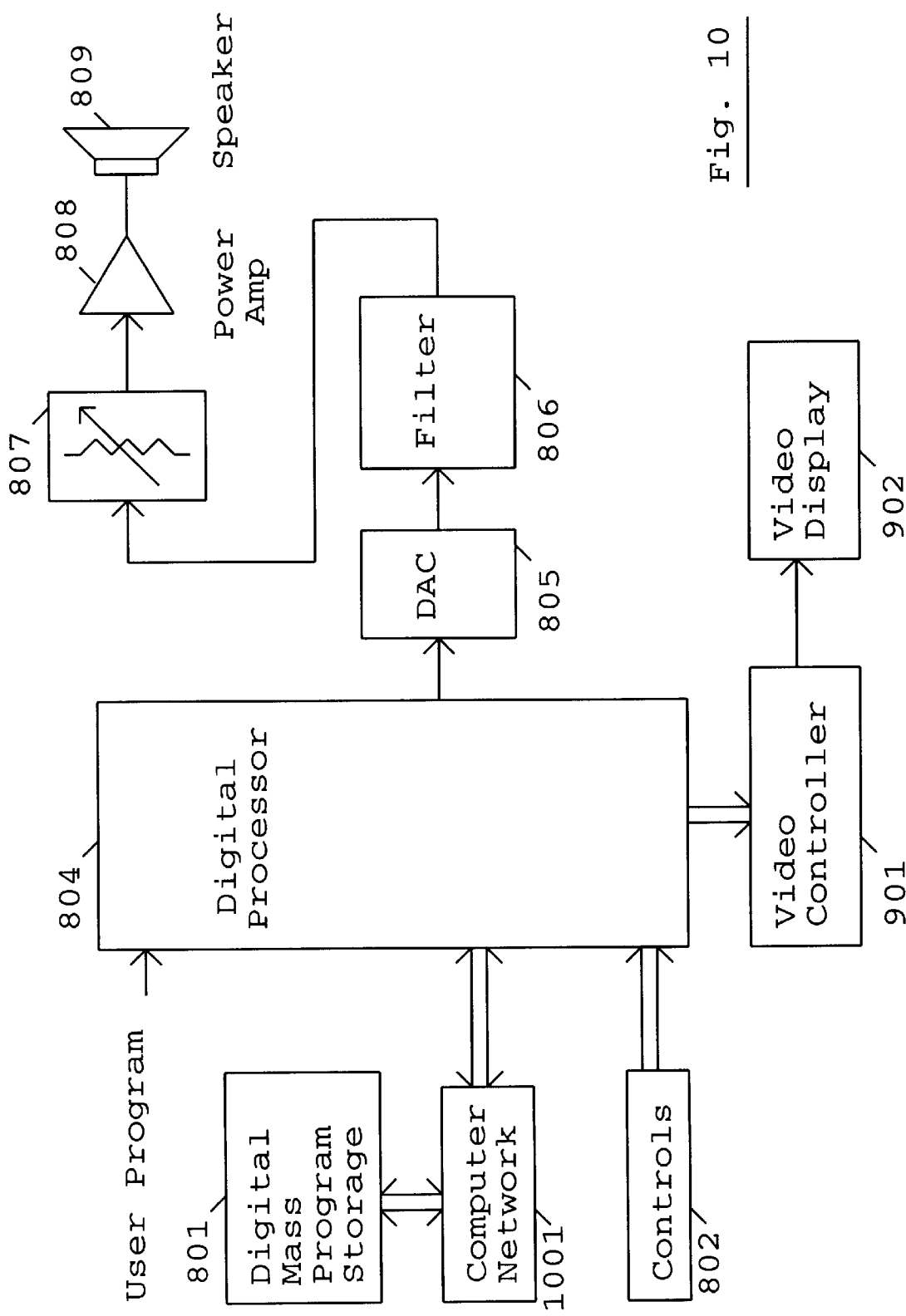
FIG. 10 shows the general form of the invention using digital technology where the simulated radio is displayed on a video display and the audio program signal is received through a computer network.

It is not necessary for Digital Mass Program Storage 801 to be physically located with Digital Processor 804. FIG. 10 shows an embodiment where Digital Mass Program Storage 801 is connected through Computer Network 1001.

Figure 11:
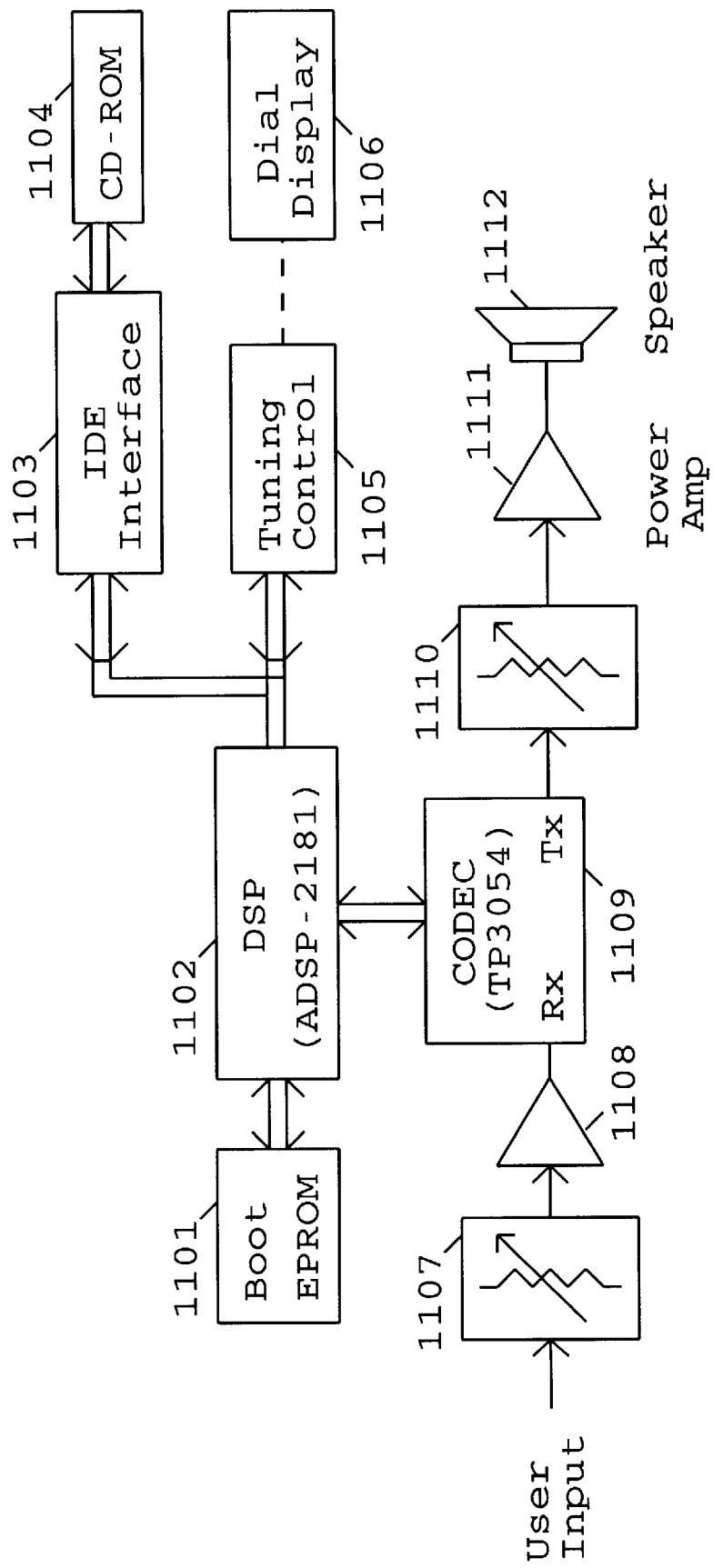
FIG. 11 shows an embodiment of the invention using a standalone digital processor and a physical reproduction of a radio cabinet with tuning and volume controls, with the audio output to the speaker in the physical cabinet.

FIG. 11 shows a standalone system for the current invention. DSP 1102 is an ADSP-2181 made by Analog Devices, Inc. and contains 8K words of program RAM as well as 8K words of data RAM. After a reset, the ADSP-2181 loads the RAM from Boot EPROM 1101. IDE Interface 1103 allows DSP 1102 to read CD-ROM 1104 which acts as Digital Mass Program Storage 801 (in FIG. 9). CODEC 1109 is a TP3054 available from Motorola, Inc. and is a standard telecommunications CODEC which is operated at an 8 KHz sample rate and uses mu-law coding. CODEC 1109 operates with incoming and outgoing data and acts as DAC 805 (FIG. 9) and Filter 806 (also FIG. 9). The signal level for the User Input is controlled by Input Control 1107 and then is amplified by Amplifier 1108. The output of CODEC 1109 goes to Volume Control 1110, Power Amplifier 1111, and finally to Speaker 1112. The dial position is read by Tuning Control 1105 which is linked to Dial Display 1106. DSP 1102 may be programmed to perform TUNING SIMULATION Method 1 or Method 2.

Creation of Audio Program Material

The simulated radio may be used to recreate the experience of listening to different eras of radio, with the radio image or radio cabinet reproduction done in the style of the era of radio being simulated. Examples of eras of radio that may be of particular interest include the 1930s, 1940s, 1950s, 1960s, and perhaps, eventually, the 1970s. Programs may be the actual recordings of radio from a particular era or the programs may be recreated. The programs may be chosen to give a general feeling of the era or they may be of a specific day of particular interest. The method may also be used to provide a realistic radio in a driving simulator or a video game. Recordings of old radio programs are available from companies such as Radio Spirits, Inc. Reproductions of old radios are available from companies such as QVC, Inc. (http://www.qvc.com). An example of a reproduction is the Crosley CR32 Replica Cathedral Style AM/FM Radio/Cassette.

Audio Program Storage—Compression of Audio Program Data

Data may be stored using a variety of compression methods. The present example uses mu-Law compression with a sampling rate of 8 KHz, which is the standard used by the Telecommunications Industry. The sampling rate of 8 KHz allows for a signal bandwith of almost 4 KHz. which is sufficient for simulating the capabilities of most AM radios.

Audio Program Storage—Mass Storage Devices

There are a wide variety of mass storage devices available. The choice of which to use involves tradeoffs of cost and amount of data storage. Table 3 shows examples of currently available mass storage devices, the storage capacity for each one, and the amount of program material that can be stored assuming mu-Law compression with a sampling rate of 8 KHz.

TABLE 3

| Device | Storage Capacity | Total Hours | Hours/channel with 8 channels |
| --- | --- | --- | --- |
| CD-ROM | 650 M Bytes | 23.7 | 3.0 |
| DVD-ROM | 4.3 G Bytes | 156.6 | 19.6 |
| DAT | 4.0 G Bytes | 145.6 | 18.2 |

Another method for storing large amounts of digital data uses a standard analog video tape recorder and is taught in U.S. Pat. No. 4,467,373 STORAGE AND RETRIEVAL OF DIGITAL DATA ON VIDEO TAPE RECORDERS issued Aug. 21, 1984 to Taylor, et al.

One method of organizing the data on a mass storage device is to interleave the data for the channels so that, for example, for a system with eight channels, a block of eight bytes contains one byte for each channel. Selecting a particular channel simply requires selecting the appropriate byte offset in the block. This way the device does not have to seek to a different track to change channels. It also allows the use of a data cache without having to purge the data cache when changing channels. For devices whose accesses are fast enough and can quickly seek to different tracks, each channel can be assigned to a different file.

The Mass Storage Source may be located locally or may be transmitted through a communications link. With a one-way system, transmitting 8 channels at 8 KHz/channel requires a data rate of 64 KBytes/sec. Existing systems that can provide this data rate include Direct Broadcast Satellite systems (DBS) such as DirectTV. Terrestrial systems such as HDTV may also be used. Interactive systems such as the Internet may also be used using additional data compression techniques. With an interactive system the server need only send the channel currently selected.

Dial Linearity

In the early days of radio each stage that needed to be tuned had its own control, so that tuning required adjusting several controls to the correct position for a particular frequency. The other problem was that where the standard variable capacitors that were then available were used, stations at the higher frequencies were jammed together. The reason for this is that in a radio tuned by a mechanical variable capacitor, the linearity of the dial depends on the relationship between the angle of the rotation of the capacitor shaft and the resulting capacitance. In the history of radio the standard local oscillator (LO) used in superheterodynes has used a standard second order Inductance/Capacitance circuit (LC). There are at least two good reasons for this:

1). An LC oscillator is simple to make with only one active device;

2). In a radio with a tuned RF stage the capacitor in the tuned RF stage is linked mechanically with the capacitor in the LO in order to enable the radio to be tuned with one control. The circuit in the tuned RF stage has always been an LC circuit because it gives the best filter characteristics that can be achieved with the simplest possible circuit. Therefore, in order for the LO to track with the tuned RF stage, the LO must also use a second order LC circuit.

The frequency of an oscillator using an LC circuit is given by the formula:

$$F = 1/(2*pi*sqrt(LC)). \qquad \text{EQN 1}$$

The consequence of using a variable capacitor whose capacitance is a linear function of the shaft rotation angle is shown in FIG. 27b.

Two methods were developed to correct this problem. One method is shown in U.S. Pat. No. 1,604,552 CONDENSOR issued Oct. 26, 1926 to Hammarlund. FIGS. 4 and 5 show Stator 17 with a curve along the midline. As Rotor 31 is rotated, the capacitance will be modified by the shape of the curve. Another method is shown in U.S. Pat. No. 1,501,543 VARIABLE CONDENSOR issued Jul. 15, 1924 to Hammarlund. FIG. 4 shows the axis of rotation of Rotor 9 and Stator 8 offset from the center of the midline. This became the standard method used in the construction of AM radios and will be analyzed here.

Referring to EQN 1, for a circuit where the inductance is constant and the capacitance is varied:

$$F=1/(2*pi*sqrt(LC))=K1/sqrt(C)$$

where K1=1/(2*pi*sqrt(L))

A superheterodyne receiver uses the principle that two signals that are multiplied together produce signals that are both the sum and difference of the two original signals. This occurs because of the trigonometric identity:

$$\sin(a)*\sin(b) = \tfrac{1}{2}*\cos(a-b) - \tfrac{1}{2}*\cos(a+b)$$

In a superheterodyne receiver for receiving standard AM broadcast signals the LO is usually tuned above the frequency of the station it is desired to receive. The frequency of the LO oscillator is varied so that the resulting frequency freq(LO)-freq(RF_signal) is constant. This difference frequency is the Intermediate Frequency (IF) which is usually 455 KHz for a standard AM broadcast receiver. (Frequencies above the LO by an amount equal to the IF also appear at the IF frequency, but these so-called "image frequencies" are filtered out in the RF stage so they are not received.)

Therefore, for a standard AM broadcast receiver to receive signals with a frequency range from 530 KHz to 1600 KHz, the LO must operate from 530 KHz+IF to 1600 KHz+IF=985 KHz. to 2055 KHz.

Returning to EQN 1:

$$F=1/(2*pi*sqrt(LC))=K1/sqrt(C)$$

where K1=1/(2*pi*sqrt(L))

For constant L, to tune a range of frequencies between a low frequency F_low and a higher frequency F_high:

F_low=K1/sqrt(C_Flow)

F_high=K1/sqrt(C_Fhigh)

where C_Flow is the capacitance needed at F_low and
C_Fhigh is the capacitance needed at F_high.

Therefore:

$$\begin{aligned}
F\_high/F\_low &= (K1/\text{sqrt}(C\_Fhigh))/(K1/\text{sqrt}(C\_Flow)) \quad \text{EQN 2}\\
&= (1/\text{sqrt}(C\_Fhigh))/(1/\text{sqrt}(C\_Flow))\\
&= \text{sqrt}(C\_Flow)/\text{sqrt}(C\_Fhigh)\\
&= \text{sqrt}(C\_Flow/C\_Fhigh)\\
(F\_high/F\_low)**2 &= (C\_Flow/C\_Fhigh)\\
\text{Let: } (C\_Flow/C\_Fhigh) &= K2\\
\text{where } K2 &= (F\_high/F\_low)**2
\end{aligned}$$

Since C_Flow must have a greater capacitance than C_Fhigh, $$\begin{aligned}
\text{Assume: } & C\_Fhigh = C1\\
& C\_Flow = C\_Fhigh + C2 = C1 + C2\\
\text{Since: } & K2 = (C\_Flow/C\_Fhigh) \quad \text{(from EQN 2)}\\
& = (C1+C2)/C1\\
& C1 + C2 = K2*C1\\
& C2 = K2*C1 - C1\\
& = C1*(K2-1)
\end{aligned}$$

$$\begin{aligned}
\text{Therefore: } F\_high &= K1/\text{sqrt}(C\_Fhigh)\\
&= K1/\text{sqrt}(C1)\\
\text{and}&\\
F\_low &= K1/\text{sqrt}(C\_Flow)\\
&= K1/\text{sqrt}(C1+C2)\\
&= K1/\text{sqrt}(C1*(K2-1))
\end{aligned}$$

Therefore, in order to vary the frequency between F_low and F_high $$\begin{aligned}
F &= K1/(\text{sqrt}(C1 + n*C1*(K2-1)) \quad \text{for } n \text{ from 0 to 1}\\
&= K1/\text{sqrt}(c1)/(\text{sqrt}(1+n*(K2-1))\\
&= K3/(\text{sqrt}(1+n*(K2-1))\\
\text{where } K3 &= K1/(\text{sqrt}(C1))\\
&= ((F\_high/F\_low)**2)/\text{sqrt}(C1)
\end{aligned}$$

We are now in a position to calculate the parameters for a standard AM receiver.

$$\begin{aligned}
\text{From EQN 2 } & (C\_Flow/C\_Fhigh) = K2 \text{ where } K2 = (F\_high/F\_low)**2\\
& \text{for } F\_high = 2055\,\text{KHz and } F\_low = 985\,\text{KHz}\\
& (C\_Flow/C\_Fhigh) = (F\_high/F\_low)**2\\
& = (2055/985)**2\\
& = 9.113564
\end{aligned}$$

Thus, in order to tune a frequency range of 530 KHz to 1600 KHz with an IF of 455 KHz, the capacitance in the LO must have a tuning range ratio of approximately 9.11:1.

As shown in FIG. 22, the variable capacitor under consideration consists of semicircular stator 220 aligned with a semicircular rotor. (The rotator is obscured by stator 220.)

In an ideal variable capacitor the capacitance is proportional to the amount of rotor area that overlaps with the stator area. A real capacitor also contains parasitic capacitance which will be considered later.

Figure 23:
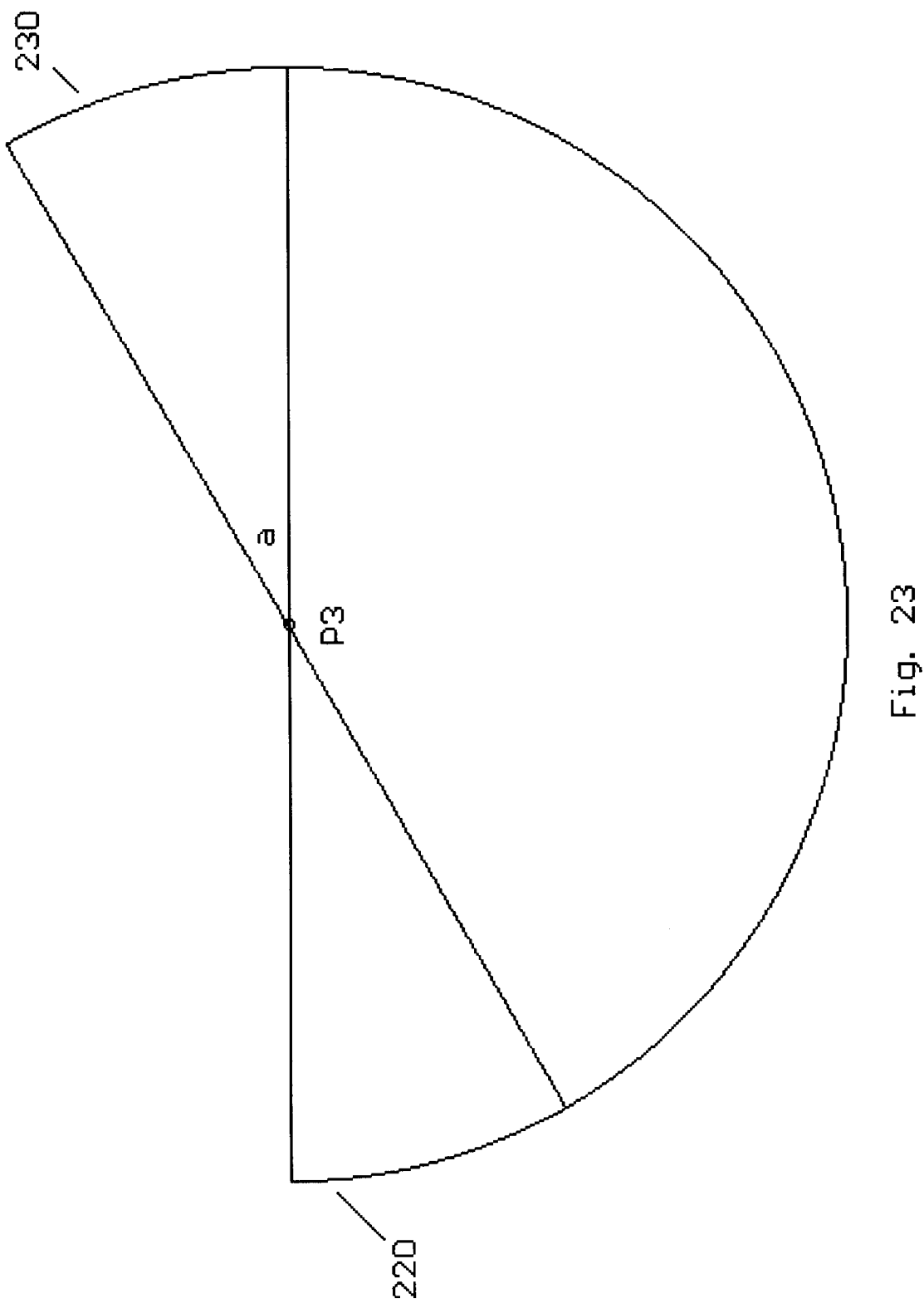
FIG. 23 shows a variable capacitor with the axis of rotation located in the center of the rotor/stator midline.

Referring to FIG. 23, where the center of rotation (P3) is in the center of the midline of both rotor 230 and stator 220 the overlap is proportional to angle of rotation a.

Figure 24:
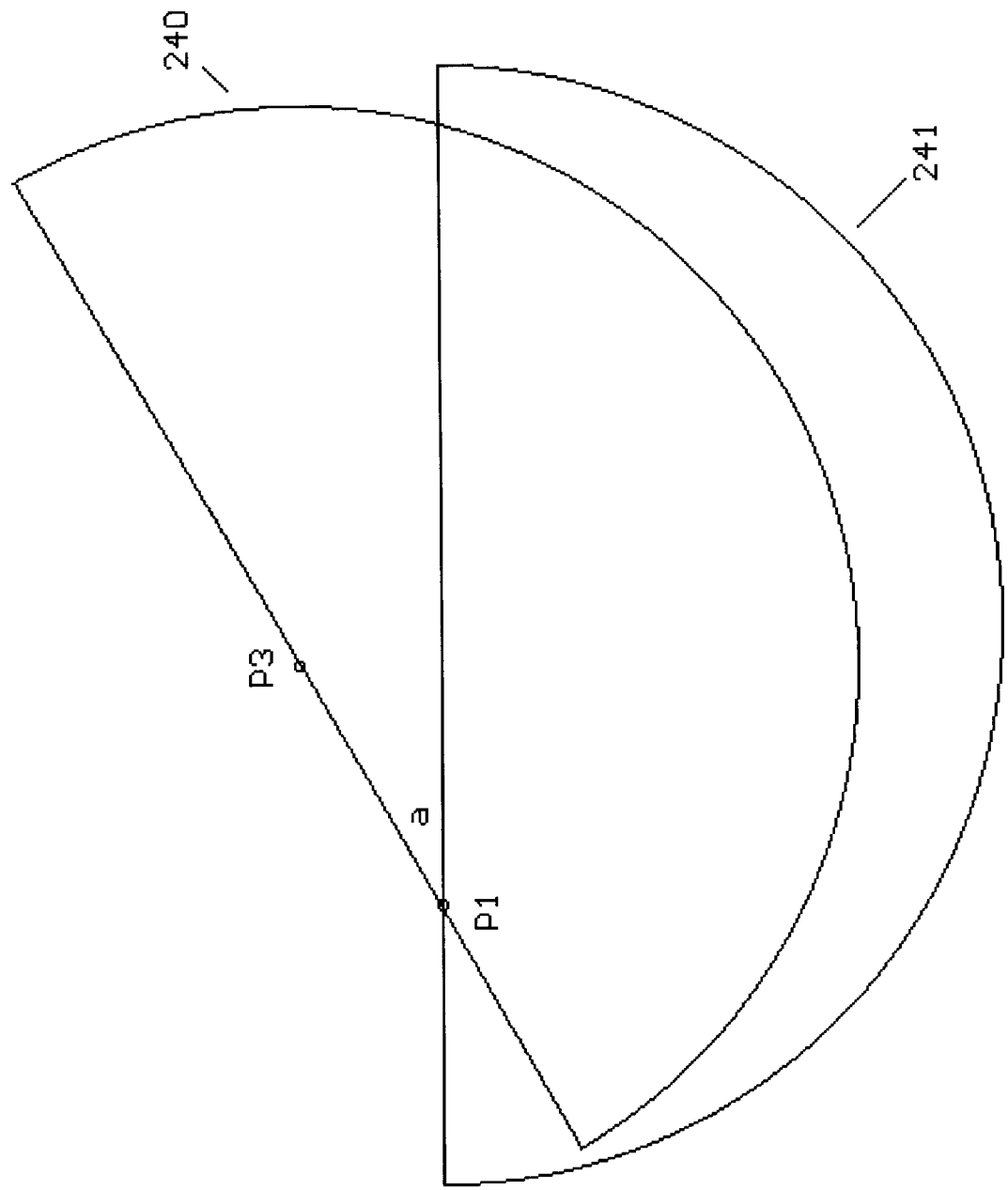
FIG. 24 shows a variable capacitor with the axis of rotation located offset from the center of the rotor/stator midline.
Figure 25:
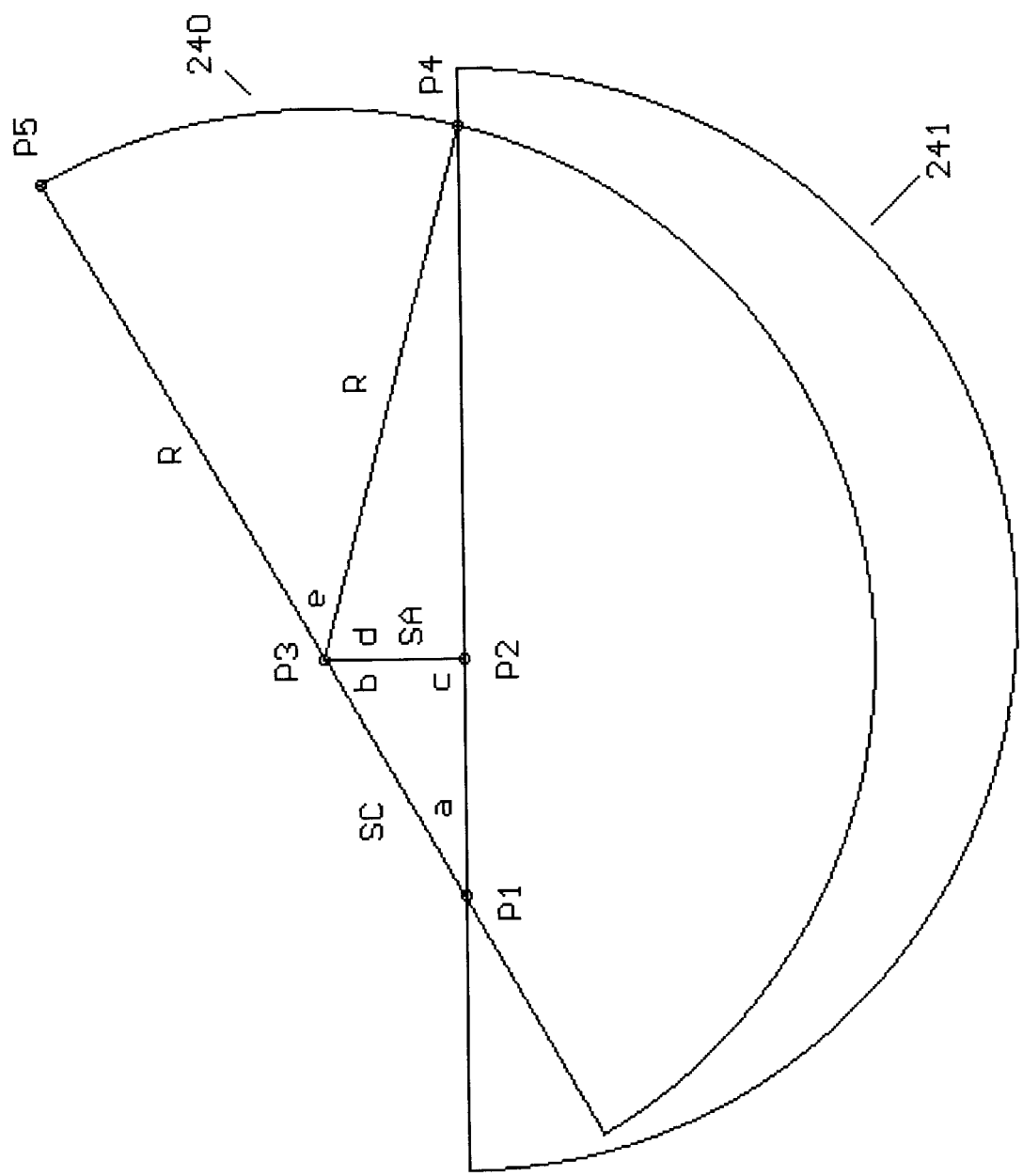
FIG. 25 shows a variable capacitor with the axis of rotation located offset from the center of the rotor/stator midline with various geometric quantities marked in order to derive a formula for calculating capacitance as a function of rotation angle.

To modify the relationship between angle of rotation and capacitance the center of rotation is offset to P1 as shown in FIG. 24. Referring to FIG. 25, this relationship is derived as follows.

To calculate the amount of overlap between rotor 240 and stator 241 we will take the total area of rotor 240 and subtract the area of the triangle formed by points P1, P3, and P4 as well as the area of the section defined by points P3, P4, and P5. After determining the area of overlap we will divide by the total area of rotor 240 to obtain the ratio of overlap. In the following work, all angles are in degrees.

$$\text{Overlap\_ratio} = \frac{\text{Area(rotor)} - \text{Area}(P1,P3,P4) - \text{Area}(P3,P4,P5)}{\text{Area(rotor)}}$$

1. Area(rotor)=½*pi*R*R
2. Area(P1,P3,P4)=n*R*R*SIN(b+d)
   a) The radius of the semicircle defining both rotor 240 and stator 241 is R.

b) The angle of rotation is angle a.
c) The amount of offset of the center of rotation is SC. Expressed as a fraction of the radius, it is n*R, where n may be from 0 to 1.
d) SC=n*R (by definition)
e) SA=SC*SIN(a)=n*R*SIN(a) (Triangle P1,P2,P3 is a right triangle, and angle c=90 degrees.)
f) b=180−90−a=90−a (The interior angles of a triangle add up to 180 degrees.)
g) d=ACOS(SA/R)=ACOS(n*R*SIN(a)/R)=ACOS(n*SIN(a))

3. Area(P3,P4,P5) is a simple segment of a circle so that Area(P3,P4,P5)=e/360*pi*R*R where e=180−b−d Putting it all together yields:

$$\begin{aligned}
\text{Overlap\_ratio} &= \frac{\text{Area(rotor)} - \text{Area}(P1, P3, P4) - \text{Area}(P3, P4, P5)}{\text{Area(rotor)}} \\
&= 1 - \frac{\text{Area}(P1, P3, P4) - \text{Area}(P3, P4, P5)}{\text{Area(rotor)}} \\
&= 1 - \frac{\text{Area}(P1, P3, P4) - \text{Area}(P3, P4, P5)}{1/2 * pi * R * R} \\
&= 1 - \frac{n * R * R * \text{SIN}(b + d) - e/360 * pi * R * R}{1/2 * pi * R * R} \\
&= 1 - \frac{n * R * R * \text{SIN}(90 - a + d) - ((180 - b - d)/360 * pi * R * R)}{1/2 * pi * R * R} \\
&= 1 - \frac{n * \text{SIN}(90 - a + d) - ((180 - (90 - a) - d)/360 * pi)}{1/2 * pi} \\
&= 1 - \frac{n * \text{SIN}(90 - a + d) - (90 + a - d/360 * pi)}{1/2 * pi} \\
&= 1 - \frac{2 * n * \text{SIN}(90 - a + d)}{pi} - \frac{2 * (90 + a - d)}{360} \\
&= 1 - \frac{2 * n * \text{COS}(a - d)}{pi} - \frac{(90 + a - d)}{180}
\end{aligned}$$

EQN 3 where: d=ACOS(n*SIN(a))
Where the trigonometric functions are in radians, EQN 3 is expressed as:

$$\begin{aligned}
\text{Overlap\_ratio} &= 1 - \frac{2 * n * \text{COS}(a - d)}{pi} - \frac{(90 + a - d)}{180} \\
&= 1 - \frac{2 * n * \text{COS}(arads - d)}{pi} - \frac{(krads + arads - d)}{pi} \\
&= 1 - \frac{2 * n * \text{COS}(arads - d) - (krads + arads - d)}{pi}
\end{aligned}$$

As was previously mentioned, variable capacitors also contain some parasitic capacitance. Also, in order to tune the circuit, additional capacitance is usually added. As has been previously calculated the ratio of maximum capacitance to minimum capacitance must be 9.11:1. Thus, the total parasitic and added circuit capacitance will be assumed to be 10.98% of the maximum capacitance (1/9.11).

FIG. 26a shows the relationship of capacitance versus shaft rotation for a variable capacitor with the center of rotation in the center of the rotor/stator midline (n=0.0). The frequency of an LC circuit using this capacitor is shown in FIG. 26b. From EQN 1, in an LC circuit:

frequency=1/(2*pi*sqrt(L*C))

which explains why the frequency changes more rapidly as the capacitance decreases.

FIG. 26c shows the relationship of capacitance versus shaft rotation for a variable capacitor with n=0.333. The frequency curve produced by this capacitor is shown in FIG. 26d. The slightly flattened shape to the low end of the curve will cause the stations in the low end of the frequency range to be spread out somewhat more than stations on the high end.

The dials shown in FIG. 27a–27d use the 3 digit/4 digit display (600,700,800,1000,1200,1600) that most AM radios have used since perhaps the late 1970s. Before that, most AM radios used a 2 digit/3 digit display (60,70,80,100,120, 140,160).

FIG. 27a shows a tuning dial with a linear frequency spacing. The apparent crowding at the low frequencies is due to the choice of frequencies to be displayed. Most AM radios display these frequencies, which may have been chosen to minimize the crowding at the high end caused by the early use of variable capacitors which did not attempt to linearize the dial (FIG. 27b).

FIG. 27b shows a tuning dial with the frequency spacing produced by a circuit using a variable capacitor with the axis of rotation located in the center of the rotor/stator midline. Note the extreme crowding at the high frequencies. In addition to the crowding caused as a consequence of EQN 1, there is the simple fact that frequencies starting with 1000 require one more digit than frequencies below 1000 (such as 900).

FIG. 27c shows a tuning dial with the frequency spacing produced by a circuit using a variable capacitor with the axis of rotation located with a particular offset from the center of the rotor/stator midline. It is not exactly linear, as in FIG. 27a, but presents a pleasing distribution of frequencies. However, this method requires more processing power than using a simple linear dial (FIG. 27a).

FIG. 27d shows a tuning dial for a representative AM radio, in this case a 1970s vintage Marantz 2230. The distribution of frequencies is similar to that produced in FIG. 27c.

When the simulated radio is displayed on a video display, as in FIG. 9, the radio will be tuned by either pressing keys on the keyboard or by using a computer mouse. (Either method may constitute Controls 802.) In either case the tuning controls provide a linear count. This linear count can be used to produce the linear dial of FIG. 27a or it can be used with EQN 3 and EQN 1 to produce the dial function of FIG. 27c. The linear dial function of FIG. 27a has the advantage of requiring minimal processing time. The dial function of FIG. 27c produces a more realistic result but requires more computer processing power. Another method would be to display the dial of FIG. 27d but use a linear dial tuning function. The dial would look right, as in FIG. 27d, but the stations would actually be distributed as per FIG. 27a.

When the simulated radio uses a physical cabinet with a physical dial, as in FIG. 8, the tuning mechanism may be a standard resistive potentiometer read by an A/D Converter or it may use an optical rotary encoder similar to that used in a standard computer mouse whose digital output provides position change and direction information. Another alternative is to use an actual variable capacitor. When used in an LC oscillator, the oscillator's frequency will exactly produce the dial function that would be produced if the capacitor were used in a real radio. This method requires a method of measuring the frequency such as using a frequency-to-voltage converter followed by an A/D Converter.

While preferred embodiments of the present invention have been shown, it is to be expressly understood that modifications and changes may be made thereto and that the present invention is set forth in the following claims.

I claim:

1. A method for simulating the tuning of an AM radio signal away from the center frequency of a station comprising the steps of:
   (a) providing an audio program signal;
   (b) providing a first multiplication product of said audio program signal and a first gain function;
   (c) providing a distortion function of said audio program signal;
   (d) providing a second multiplication product of said distortion function of said audio program signal and a second gain function;
   (e) providing a noise signal;
   (f) providing a third multiplication product of said noise signal and a third gain function;
   (g) providing an adder for adding said first multiplication product, said second multiplication product, and said third multiplication product, whereby the output of said adder is used to output an audio signal;
   (h) providing a tuning control;
   (i) providing an audio processor, whereby said audio processor responds to said tuning control to perform the steps of:
      (i) selecting said first gain function,
      (ii) selecting said second gain function,
      (iii) selecting said third gain function.

2. A method for simulating the tuning of an AM radio signal away from the center frequency of a station comprising the steps of:
   (a) providing an audio program signal;
   (b) providing one or more frequency adjustable filters;
   (c) providing a first multiplication product of the output of said one or more frequency selectable filters and a first gain function;
   (d) providing a foldover function;
   (e) providing a threshold function for said foldover function;
   (f) providing a second multiplication product of said foldover function and a second gain function;
   (g) providing a noise signal;
   (h) providing a third multiplication product of said noise signal and a third gain function;
   (i) providing a fourth multiplication product of said audio program signal and said noise signal;
   (j) providing a fifth multiplication product of said fourth multiplication product and a fourth gain function;
   (k) providing an adder for adding said first multiplication product, said second multiplication product, said third multiplication product, and said fifth multiplication product, whereby the output of said adder is used to output an audio signal;
   (l) providing a tuning control;
   (m) providing an audio processor, whereby said audio processor responds to said tuning control to perform the steps of:
      (i) selecting one or more filter characteristics of said one or more frequency adjustable filters,
      (ii) selecting said threshold function for said foldover function,
      (iii) selecting said first gain function,
      (iv) selecting said second gain function,
      (v) selecting said third gain function,
      (vi) selecting said fourth gain function.

3. A simulated AM radio comprising:
   (a) one or more audio program signals;
   (b) a means for selecting one of said one or more audio program signals;
   (c) a first multiplier for multiplying the selected audio program signal by a first gain function;
   (d) a distortion function of said selected audio program signal;
   (e) a second multiplier for multiplying said distortion function of said selected audio program signal by a second gain function;
   (f) a noise signal;
   (g) a third multiplier for multiplying said noise signal by a third gain function;
   (h) an adder for adding the product of said first multiplier, the product of said second multipler, and the product of said third multiplier, whereby the output of said adder is used to output an audio signal;
   (i) a tuning control for simulating the tuning control of an AM radio;
   (j) a digital processor, to simulate the effect of tuning an AM radio, whereby said digital processor responds to said tuning control to:
      (i) select said one of said one or more audio program signals,
      (ii) select said first gain function,
      (iii) select said second gain function,
      (iv) select said third gain function.

4. The simulated AM radio of claim 3 wherein said one or more audio program signals are stored in a digital mass program storage device.

5. The simulated AM radio of claim 4 wherein said digital mass program storage device is selected from the group consisting of CD-ROM, DVD-ROM, and DAT.

6. The simulated AM radio of claim 3 wherein said one or more audio program signals includes a user supplied audio signal.

7. The simulated AM radio of claim 3 wherein said distortion function comprises full wave rectification of said selected audio program signal.

8. The simulated AM radio of claim 3 wherein said distortion function comprises squaring the values of said selected audio program signal.

9. The simulated AM radio of claim 3 wherein said noise signal comprises a linear feedback shift register.

10. The simulated AM radio of claim 3 further including a computer network whereby said digital processor receives said one or more audio program signals through said computer network.

11. A simulated AM radio comprising:
   (a) one or more audio program signals;
   (b) a means for selecting one of said one or more audio program signals;
   (c) a digital filter;
   (d) a first multiplier for multiplying the output of said digital filter by a first gain function;
   (e) a foldover function;
   (f) a threshold function for said foldover function;
   (g) a second multiplier for multiplying said foldover function by a second gain function;
   (h) a noise signal;
   (i) a third multiplier for multiplying said noise signal by a third gain function;
   (j) a fourth multiplier for multiplying the selected audio program signal by said noise signal;
   (k) a fifth multiplier for multiplying the product of said fourth multiplier by a fourth gain function;
   (l) an adder for adding the product of said first multiplier, the product of said second multiplier, the product of said third multiplier, and the product of said fifth multiplier, whereby the output of said adder is used to output an audio signal;
   (m) a tuning control;
   (n) a digital processor, to simulate the effect of tuning an AM radio, whereby said digital processor responds to said tuning control to:
      (i) select said one of said one or more audio program signals,
      (ii) select one or more filter characteristics of said digital filter,
      (iii) select said threshold function for said foldover function,
      (iv) select said first gain function,
      (v) select said second gain function,
      (vi) select said third gain function,
      (vii) select said fourth gain function.

12. The simulated AM radio of claim 11 wherein said one or more audio program signals are stored in a digital mass program storage device.

13. The simulated AM radio of claim 12 wherein said digital mass program storage device is selected from the group consisting of CD-ROM, DVD-ROM, and DAT.

14. The simulated AM radio of claim 11 wherein said one or more audio program signals includes a user supplied audio signal.

15. The simulated AM radio of claim 11 wherein said noise signal comprises a linear feedback shift register.

16. The simulated AM radio of claim 11 further including a computer network whereby said digital processor receives said one or more audio program signals through said computer network.

17. A method for simulating the reception of AM radio signals comprising the computer implemented steps of:
   (a) providing one or more audio program signals;
   (b) selecting one of said one or more audio program signals;
   (c) providing a first multiplication product of the selected audio program signal and a first gain function;
   (d) providing a distortion function of said selected audio program signal;
   (e) providing a second multiplication product of said distortion function of said selected audio program signal and a second gain function;
   (f) providing a noise signal;
   (g) providing a third multiplication product of said noise signal and a third gain function;
   (h) providing an adder for adding said first multiplication product, said second multiplication product, and said third multiplication product, whereby the output of said adder is used to output an audio signal;
   (i) providing a tuning control, to simulate the effect of receiving the AM signals, whereby said tuning control is used to:
      (i) select said one of said one or more audio program signals,
      (ii) select said first gain function,
      (iii) select said second gain function,
      (iv) select said third gain function.

18. A method for simulating the reception of AM radio signals comprising the computer implemented steps of:
   (a) providing one or more audio program signals;
   (b) selecting one of said one or more audio program signals;
   (c) providing a digital filter;
   (d) providing a first multiplication product of the output of said digital filter and a first gain function;
   (e) providing a foldover function;
   (f) providing a threshold function for said foldover function;
   (g) providing a second multiplication product of said foldover function and a second gain function;
   (h) providing a noise signal;
   (i) providing a third multiplication product of said noise signal and a third gain function;
   (j) providing a fourth multiplication product of the selected audio program signal and said noise signal;
   (k) providing a fifth multiplication product of said fourth multiplication product and a fourth gain function;
   (l) providing an adder for adding said first multiplication product, said second multiplication product, said third multiplication product, and said fifth multiplication product, whereby the output of said adder is used to output an audio signal;
   (m) providing a tuning control, to simulate the effect of receiving the AM signals, whereby said tuning control is used to:
      (i) select said one of said one or more audio program signals,
      (ii) select one or more filter characteristics of said digital filter,
      (iii) select said threshold function for said foldover function,
      (iv) select said first gain function,
      (v) select said second gain function,
      (vi) select said third gain function,
      (vii) select said fourth gain function.

* * * * *